US012610665B2

(12) United States Patent
Yoo et al.

(10) Patent No.: US 12,610,665 B2
(45) Date of Patent: Apr. 21, 2026

(54) DISPLAY DEVICE AND METHOD OF MANUFACTURING THE SAME

(71) Applicant: Samsung Display Co., LTD., Yongin-si (KR)

(72) Inventors: Je Won Yoo, Yongin-si (KR); Min Joo Kim, Yongin-si (KR); Hoon Kim, Yongin-si (KR); Seung Kyu Lee, Yongin-si (KR); Yong Sik Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 18/338,523

(22) Filed: Jun. 21, 2023

(65) Prior Publication Data

US 2024/0014356 A1 Jan. 11, 2024

(30) Foreign Application Priority Data

Jul. 11, 2022 (KR) ........................ 10-2022-0085241

(51) Int. Cl.
H10H 20/85 (2025.01)
H01L 25/16 (2023.01)
H10H 20/01 (2025.01)
(52) U.S. Cl.
CPC ....... H10H 20/8506 (2025.01); H01L 25/167 (2013.01); H10H 20/036 (2025.01)
(58) Field of Classification Search
CPC .. H10H 20/8506; H10H 20/036; H10H 20/85;

H10H 20/857; H10H 20/01; H10H 20/0364; H10H 20/84; H10H 20/855; H10H 20/882; H10H 29/142; H01L 25/167; H01L 25/0753; H10D 86/021; H10D 86/441

See application file for complete search history.

(56) References Cited

U.S. PATENT DOCUMENTS 10,658,605 B2 5/2020 Lee et al.
2024/0006558 A1* 1/2024 Park ........................ H10H 29/37

FOREIGN PATENT DOCUMENTS

KR 10-2407848 6/2022

* cited by examiner

*Primary Examiner* — Anne M Hines

*Assistant Examiner* — Jose M Diaz

(74) *Attorney, Agent, or Firm* — Womble Bond Dickinson (US) LLP

(57) ABSTRACT

A display device according to an embodiment of the disclosure includes a channel formation pattern disposed on a base layer and including a first channel and a second channel spaced apart from each other; and a light emitting element disposed on the channel formation pattern. The light emitting element is aligned between the first channel and the second channel.

20 Claims, 19 Drawing Sheets

CNE: CNE1, CNE2

PXL(SPXL): SPXL1, SPXL2, SPXL3

SPXL: SPXL1, SPXL2, SPXL3
LD: LD1, LD2, LD3
EMA: EMA1, EMA2, EMA3

FIG. 5

CNE: CNE1, CNE2

FIG. 7

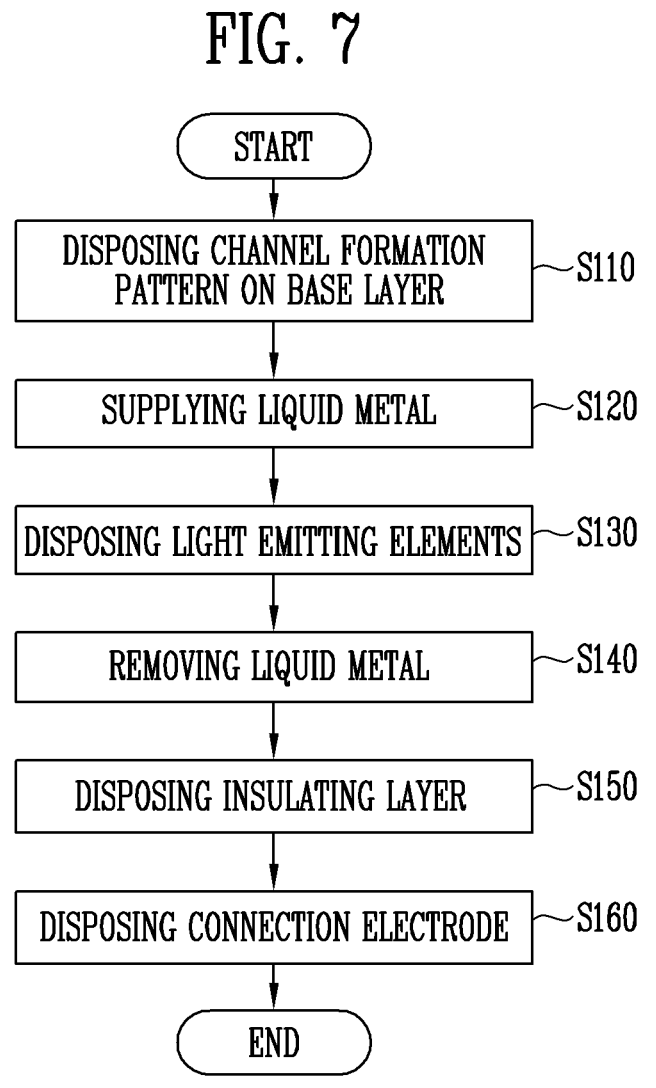

START

DISPOSING CHANNEL FORMATION
PATTERN ON BASE LAYER — S110

SUPPLYING LIQUID METAL — S120

DISPOSING LIGHT EMITTING ELEMENTS — S130

REMOVING LIQUID METAL — S140

DISPOSING INSULATING LAYER — S150

DISPOSING CONNECTION ELECTRODE — S160

END

DR3

A       122       142       A'

100

PCL

BSL

DR3

CNE: CNE1, CNE2

AP: AP1, AP2
APA: APA1, APA2
200: 220, 222, 240, 242

AP: AP1, AP2
APA: APA1, APA2
200: 220, 222, 240, 242

AP: AP1, AP2
APA: APA1, APA2
CH: 120, 122, 140, 142

AP: AP1, AP2
APA: APA1, APA2
CH: 120, 122, 140, 142
CNE: CNE1, CNE2

DISPLAY DEVICE AND METHOD OF MANUFACTURING THE SAME

CROSS-REFERENCE TO RELATED APPLICATION(S)

The application claims priority to and the benefits of Korean Patent Application No. 10-2022-0085241 under 35 U.S.C. § 119(a), filed on Jul. 11, 2022, in the Korean Intellectual Property Office (KIPO), the entire content of which are incorporated herein by reference.

BACKGROUND

1. Technical Field

The disclosure relates to a display device and a method of manufacturing the same.

2. Description of the Related Art

In recent years, as interest in information displays increases, research and development on display devices are continuously being made.

SUMMARY

An object of the disclosure is to provide a display device in which a risk due to light reflection can be substantially eliminated, and a method of manufacturing the same.

Another object of the disclosure is to provide a display device robust against external impact and a method of manufacturing the same.

A display device according to an embodiment of the disclosure may include a channel formation pattern disposed on a base layer and including a first channel and a second channel spaced apart from each other, and light emitting elements disposed on the channel formation pattern. The light emitting elements may be aligned between the first channel and the second channel.

According to an embodiment, at least a portion of the first channel and the second channel may be hollows surrounded by the channel formation pattern.

According to an embodiment, the display device may further include a pixel circuit layer disposed on the base layer and including circuit elements. The first channel and the second channel may be surrounded by an upper surface of the pixel circuit layer and the channel formation pattern.

According to an embodiment, the channel formation pattern may include an insulating polymer.

According to an embodiment, the channel formation pattern may physically separate the first channel and the second channel.

According to an embodiment, the channel formation pattern may include grooves corresponding to the first channel and the second channel.

According to an embodiment, the display device may further include a first sub-pixel of a first color, a second sub-pixel of a second color, and a third sub-pixel of a third color. The light emitting elements may include first light emitting elements arranged in the first sub-pixel and emitting light of the first color, second light emitting elements arranged in the second sub-pixel and emitting light of the second color, and third light emitting elements arranged in the third sub-pixel and emitting light of the third color.

According to an embodiment, each of the first light emitting elements, the second light emitting elements, and the third light emitting elements may emit light of different colors.

According to an embodiment, the display device may further include a scattering layer disposed on the light emitting elements, an overcoat layer disposed on the scattering layer, and an outer film layer disposed on the overcoat layer.

According to an embodiment, each of the first channel and the second channel may extend in a direction the light emitting elements are arranged.

A display device according to an embodiment of the disclosure may include a first sub-pixel and a second sub-pixel. Each of the first sub-pixel and the second sub-pixel may include a first channel and a second channel, each disposed on a base layer and formed of a hollow, and a channel formation pattern defining the first channel and the second channel. The first sub-pixel may further include first light emitting elements emitting light of a first color. The second sub-pixel may further include second light emitting elements emitting light of a second color that is different from the first color. The first channel and the second channel may be formed in the channel formation pattern without a conductive pattern directly adjacent thereto.

A method of manufacturing a display device according to an embodiment of the disclosure may include forming a channel formation pattern including a channel on a base layer, supplying a liquid metal to the channel, disposing a light emitting element on the channel formation pattern, and removing the liquid metal from the channel.

According to an embodiment, the base layer may include a cell area to which the light emitting element is supplied. The channel may include an outer channel surrounding at least a portion of the cell area. The outer channel may include an inlet portion to which the liquid metal is supplied on an end, and an outlet portion from which the liquid metal is discharged on another end.

According to an embodiment, the method of manufacturing the display device may further include forming an alignment pad to which an alignment signal is applied on a side of the cell area on the base layer. The supplying of the liquid metal may include forming an outer liquid metal part in the outer channel, and electrically connecting the outer liquid metal part and the alignment pad.

According to an embodiment, the channel may include a first channel and a second channel formed in the cell area. The outer channel may include a first outer channel and a second outer channel fluidly separated from each other. The first channel and the first outer channel may be fluidly connected to each other. The second channel and the second outer channel may be fluidly connected to each other.

According to an embodiment, the method of manufacturing the display device may further include forming an insulating layer on the light emitting element, the inlet portion, and the outlet portion.

According to an embodiment, the method of manufacturing the display device may further include forming a connection electrode electrically connected to the light emitting element. A portion of the insulating layer formed on the light emitting element may expose a first end and a second end of the light emitting element, and the connection electrode may be electrically connected to the first end and the second end of the light emitting element.

According to an embodiment, the supplying of the liquid metal may include supplying at least a portion of the liquid metal to the first channel to form a first liquid metal part, and supplying at least another portion of the liquid metal to the second channel to form a second liquid metal part. The disposing of the light emitting element may include supplying a first alignment signal to the first liquid metal part, supplying a second alignment signal to the second liquid metal part, and aligning the light emitting element in response to an electric field formed by the first alignment signal and the second alignment signal.

According to an embodiment, the removing of the liquid metal may include forming a hollow in the channel.

According to an embodiment, the channel formation pattern may include an insulating polymer.

BRIEF DESCRIPTION OF THE DRAWINGS

The accompanying drawings, which are included to provide a further understanding of the disclosure, and are incorporated in and constitute a part of this specification, illustrate embodiments of the disclosure, and, together with the description, serve to explain principles of the disclosure.

FIG. 5 is a plan view schematically illustrating a sub-pixel according to an embodiment.

FIG. 7 is a flowchart of a method of manufacturing a display device according to an embodiment.

DETAILED DESCRIPTION OF THE EMBODIMENTS

Figure 1:
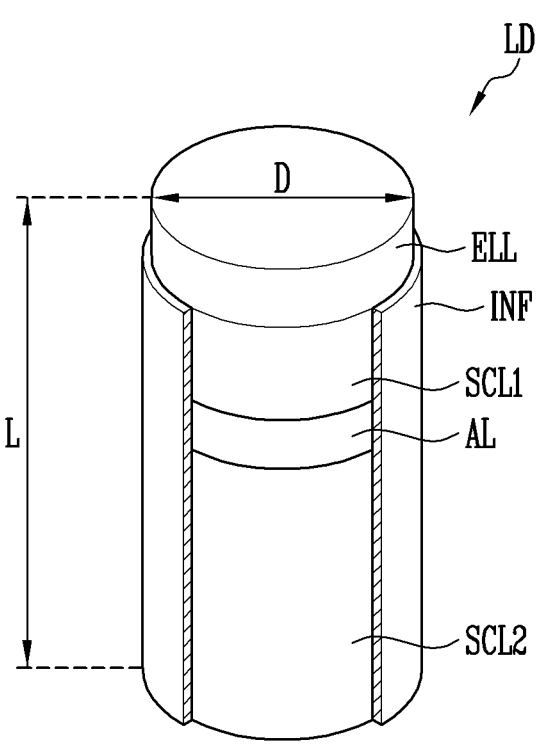
FIG. 1 is a perspective view schematically illustrating a light emitting element according to an embodiment.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element. In the disclosure, the singular expressions are intended to include the plural expressions as well, unless the context clearly indicates otherwise.

It will be further understood that the terms "comprise", "include", "have", etc. used in the disclosure, specify the presence of stated features, integers, steps, operations, elements, components, or combinations of them but do not preclude the presence or addition of one or more other features, integers, steps, operations, elements, components, or combinations thereof.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure relates to a display device and a method of manufacturing the same. Hereinafter, a display device and a method of manufacturing the same according to an embodiment will be described with reference to the accompanying drawings.

Figure 2:
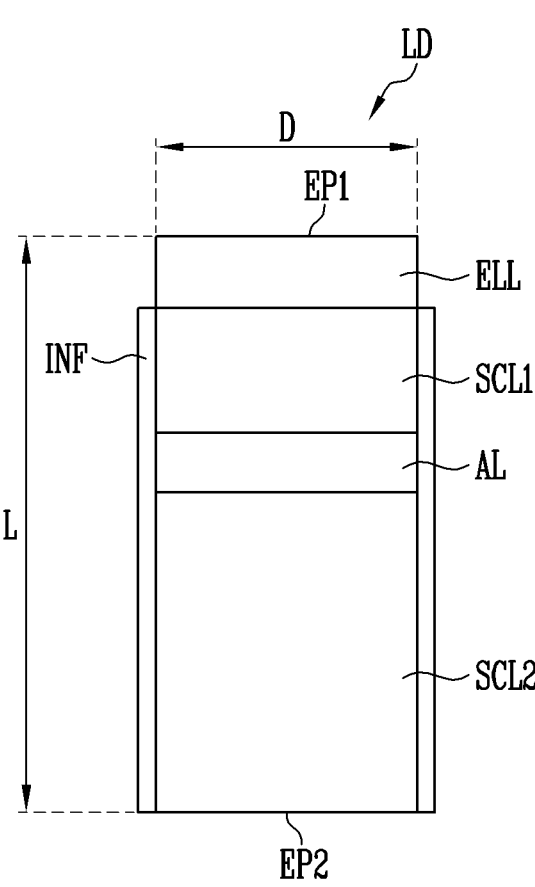
FIG. 2 is a schematic cross-sectional view schematically illustrating the light emitting element according to an embodiment.

A light emitting element LD according to an embodiment will be described with reference to FIGS. 1 and 2. FIG. 1 is a perspective view schematically illustrating a light emitting element according to an embodiment. FIG. 2 is a schematic cross-sectional view schematically illustrating the light emitting element according to an embodiment.

According to an embodiment, the light emitting element LD may be configured to emit light. For example, the light emitting element LD may be a light emitting diode including an inorganic material. According to an embodiment, the light emitting element LD may be configured to emit light of one color. For example, the light emitting element LD may include a first light emitting element LD1 emitting light of a first color, a second light emitting element LD2 emitting light of a second color, and a third light emitting element LD3 emitting light of a third color (refer to FIG. 4).

The light emitting element LD may have various shapes. For example, the light emitting element LD may have a shape extending in a direction. FIGS. 1 and 2 show the light emitting element LD having a columnar shape. However, the type and shape of the light emitting element LD are not limited to the above-described embodiment.

The light emitting element LD may include a first semiconductor layer SCL1, a second semiconductor layer SCL2, and an active layer AL disposed between the first and second semiconductor layers SCL1 and SCL2. For example, in case that a direction in which the light emitting element LD extends is referred to as a length L direction, the light emitting element LD may include the first semiconductor layer SCL1, the active layer AL, and the second semiconductor layer SCL2 sequentially stacked along the length L direction. The light emitting element LD may also include an electrode layer ELL and an element insulating film INF.

The light emitting element LD may be provided in a columnar shape extending in a direction. The light emitting element LD may have a first end EP1 and a second end EP2. The first semiconductor layer SCL1 may be disposed adjacent to the first end EP1 of the light emitting element LD, and the second semiconductor layer SCL2 may be disposed adjacent to the second end EP2 of the light emitting element LD. The electrode layer ELL may be disposed adjacent to the first end EP1.

The light emitting element LD may be a light emitting element manufactured in a columnar shape through an etching process. The columnar shape may include a rod-like shape or a bar-like shape elongated in the length L direction (for example, having an aspect ratio greater than 1), such as a cylinder or polygonal column, but the cross-sectional shape thereof is not particularly limited. For example, the length L of the light emitting element LD may be greater than the diameter D (or the width of the cross-section).

The light emitting element LD may have a size of nano-scale to micro-scale. For example, the light emitting element LD may have the diameter D (or width) and/or the length L ranging in a range of nano-scale to micro-scale. However, the size of the light emitting element LD is not necessarily limited thereto.

The first semiconductor layer SCL1 may be a semiconductor layer of a first conductivity type. The first semiconductor layer SCL1 may be disposed on the active layer AL and may include a semiconductor layer of a different type from that of the second semiconductor layer SCL2. For example, the first semiconductor layer SCL1 may include a P-type semiconductor layer. For example, the first semiconductor layer SCL1 may include a P-type semiconductor layer including at least one semiconductor material of InAlGaN, GaN, AlGaN, InGaN, AlN, and InN and doped with a first conductivity type dopant such as Mg or the like. However, the material constituting the first semiconductor layer SCL1 is not limited thereto, and various other materials may be used to form the first semiconductor layer SCL1.

The active layer AL may be disposed between the first semiconductor layer SCL1 and the second semiconductor layer SCL2, and may have a single-quantum well structure or a multi-quantum well structure. The position of the active layer AL is not limited to a specific embodiment, and may be variously changed according to the type of the light emitting element LD.

A clad layer doped with a conductive dopant may be formed on upper and/or lower portions of the active layer AL. For example, the clad layer may be formed of an AlGaN layer or an InAlGaN layer. According to an embodiment, a material such as AlGaN, InAlGaN, or the like may be used to form the active layer AL. However, the disclosure is not limited thereto, and various other materials may be used to form the active layer AL.

The second semiconductor layer SCL2 may be a semiconductor layer of a second conductivity type. The second semiconductor layer SCL2 may be disposed on the active layer AL and may include a semiconductor layer of a different type from that of the first semiconductor layer SCL1. For example, the second semiconductor layer SCL2 may include an N-type semiconductor layer. For example, the second semiconductor layer SCL2 may include an N-type semiconductor layer including at least one semiconductor material of InAlGaN, GaN, AlGaN, InGaN, AlN, and InN and doped with a second conductivity type dopant such as Si, Ge, Sn, or the like. However, the material constituting the second semiconductor layer SCL2 is not limited thereto, and various other materials may be used to form the second semiconductor layer SCL2.

In case a voltage equal to or greater than a threshold voltage is applied to both ends of the light emitting element LD, the light emitting element LD may emit light as electron-hole pairs are combined in the active layer AL. By controlling the light emitting of the light emitting element LD using this principle, the light emitting element LD may be used as a light source of various light emitting devices including pixels PXL of a display device DD.

The element insulating film INF may be disposed on a surface of the light emitting element LD. The element insulating film INF may be formed on the surface of the light emitting element LD to surround at least an outer surface of the active layer AL. The element insulating film INF may also surround portions of the first and second semiconductor layers SCL1 and SCL2. The element insulating film INF may be formed of a single layer or a double layer, but the disclosure is not limited thereto, and may include multiple films. For example, the element insulating film INF may include a first insulating film including a first material and a second insulating film including a second material different from the first material.

The element insulating film INF may expose both ends of the light emitting element LD having different polarities. For example, the element insulating film INF may expose an end of each of the electrode layer ELL and the second semiconductor layer SCL2 adjacent to the first and second ends EP1 and EP2 of the light emitting element LD.

The element insulating film INF may include at least one insulating material of silicon oxide ($SiO_x$), silicon nitride ($SiN_x$), silicon oxynitride ($SiO_xN_y$), aluminum oxide ($AlO_x$), and titanium oxide ($TiO_x$). The element insulating film INF may have a single-layer or multi-layer structure. However, the disclosure is not necessarily limited to the above-described examples. For example, according to another embodiment, the element insulating film INF may be omitted.

According to an embodiment, in case that the element insulating film INF is provided to cover the surface of the light emitting element LD, for example, the outer surface of the active layer AL, electrical stability of the light emitting element LD may be secured. In case that the element insulating film INF is provided on the surface of the light emitting element LD, lifespan and efficiency may be improved by minimizing surface defects of the light emitting element LD. Even in case that multiple light emitting elements LD are disposed adjacent to each other, it is possible to prevent an unwanted short circuit between the light emitting elements LD.

The electrode layer ELL may be disposed on the first semiconductor layer SCL1. The electrode layer ELL may be disposed adjacent to the first end EP1. The electrode layer ELL may be electrically connected to the first semiconductor layer SCL1.

A portion of the electrode layer ELL may be exposed. For example, the element insulating film INF may expose a surface of the electrode layer ELL. The electrode layer ELL may be exposed in a region corresponding to the first end EP1.

According to an embodiment, a side surface of the electrode layer ELL may be exposed. For example, the element insulating film INF may cover side surfaces of the first semiconductor layer SCL1, the active layer AL, and the second semiconductor layer SCL2, but may not cover at least a portion of the side surface of the electrode layer ELL. The electrode layer ELL adjacent to the first end EP1 may be readily connected to other components. According to an embodiment, the element insulating film INF may expose a portion of the side surface of the first semiconductor layer SCL1 and/or the second semiconductor layer SCL2 as well as the side surface of the electrode layer ELL.

According to an embodiment, the electrode layer ELL may be an ohmic contact electrode. However, the disclosure is not necessarily limited to the above-described embodiment. For example, the electrode layer ELL may be a Schottky contact electrode.

According to an embodiment, the electrode layer ELL may include at least one of chromium (Cr), titanium (Ti), aluminum (Al), gold (Au), nickel (Ni), an oxide thereof, and an alloy thereof. However, the disclosure is not necessarily limited to the above-described embodiment. According to an embodiment, the electrode layer ELL may be substantially transparent. For example, the electrode layer ELL may include indium tin oxide (ITO). Accordingly, the emitted light may pass through the electrode layer ELL.

The structure and shape of the light emitting element LD are not limited to the above-described embodiment. The light emitting element LD may have various structures and shapes. For example, the light emitting element LD may include an additional electrode layer disposed on a surface of the second semiconductor layer SCL2 adjacent to the second end EP2.

Figure 3:
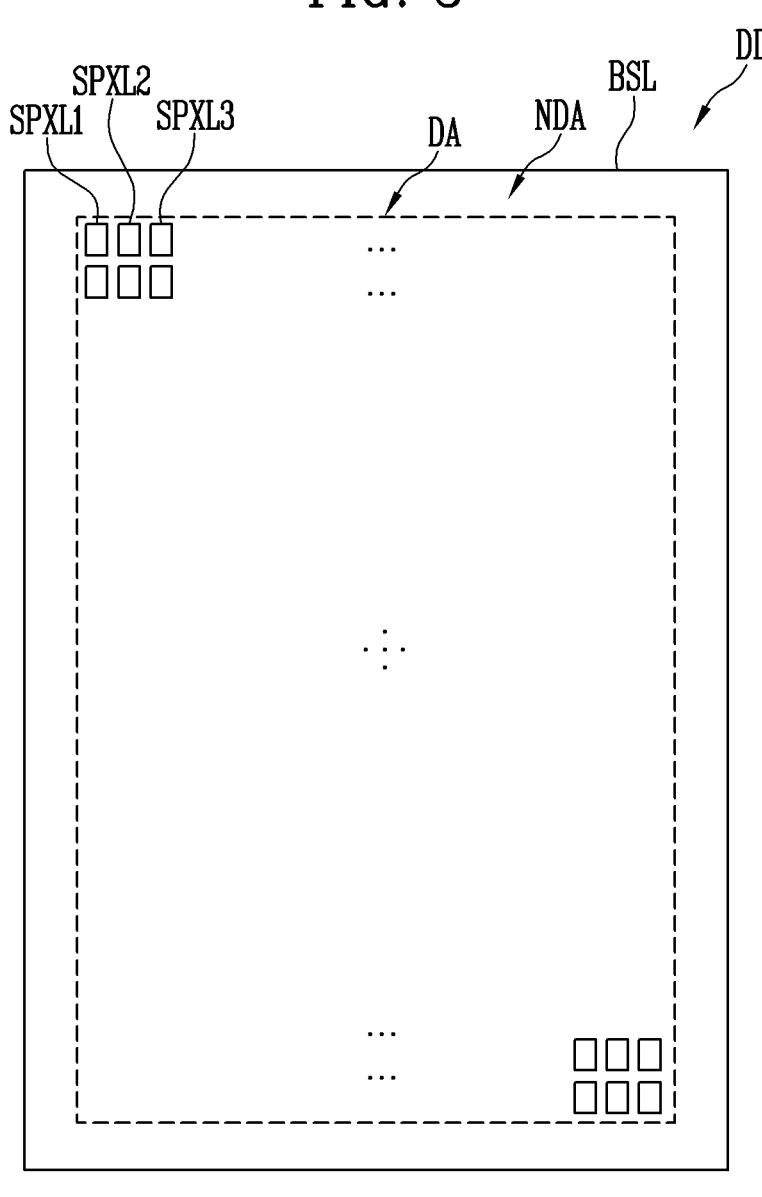
FIG. 3 is a plan view schematically illustrating a display device according to an embodiment.
Figure 3:
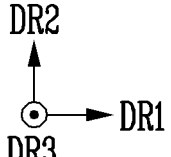

FIG. 3 is a plan view schematically illustrating a display device according to an embodiment.

Referring to FIG. 3, the display device DD may include a base layer BSL and a pixel PXL disposed on the base layer BSL. Although not shown in the drawings, the display device DD may also include a driving circuit (for example, a scan driver and a data driver) for driving the pixel PXL, wirings, and pads.

The display device DD may include a display area DA and a non-display area NDA. The non-display area NDA may be an area other than the display area DA. The non-display area NDA may surround at least a portion of the display area DA.

The base layer BSL may form a base member of the display device DD. The base layer BSL may be a rigid or flexible substrate or film. For example, the base layer BSL may be a rigid substrate made of glass or tempered glass, a flexible substrate (or thin film) made of plastic or metal, or an insulating layer. The material and/or properties of the base layer BSL are not particularly limited. In an embodiment, the base layer BSL may be substantially transparent. The term "substantially transparent" may mean that light can be transmitted with a transmittance or more. In another embodiment, the base layer BSL may be translucent or opaque. The base layer BSL may include a reflective material according to an embodiment.

The display area DA may be an area in which the pixel PXL is disposed. The non-display area NDA may be an area in which the pixel PXL is not disposed. The driving circuit, the wirings, and the pads connected to the pixel PXL of the display area DA may be disposed in the non-display area NDA.

According to an embodiment, the pixel PXL (or sub-pixels SPXL) may be arranged in a stripe or PENTILE™ arrangement structure. However, the disclosure is not necessarily limited thereto.

According to an embodiment, the pixel PXL (or sub-pixels SPXL) may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. The first sub-pixel SPXL1, the second sub-pixel SPXL2, and the third sub-pixel SPXL3 may form a pixel capable of emitting light of various colors.

For example, each of the first sub-pixel SPXL1, the second sub-pixel SPXL2, and the third sub-pixel SPXL3 may emit light of one color. For example, the first sub-pixel SPXL1 may be a red pixel emitting red (for example, the first color) light, the second sub-pixel SPXL2 may be a green pixel emitting green (for example, the second color) light, and the third sub-pixel SPXL3 may be a blue pixel emitting blue (for example, the third color) light. According to an embodiment, the number of second sub-pixels SPXL2 may be greater than the number of first sub-pixels SPXL1 and the number of third sub-pixels SPXL3. However, the color, type and/or number of the first sub-pixels SPXL1, the second sub-pixels SPXL2, and the third sub-pixels SPXL3 constituting the pixel are not limited to specific embodiment.

Figure 4:
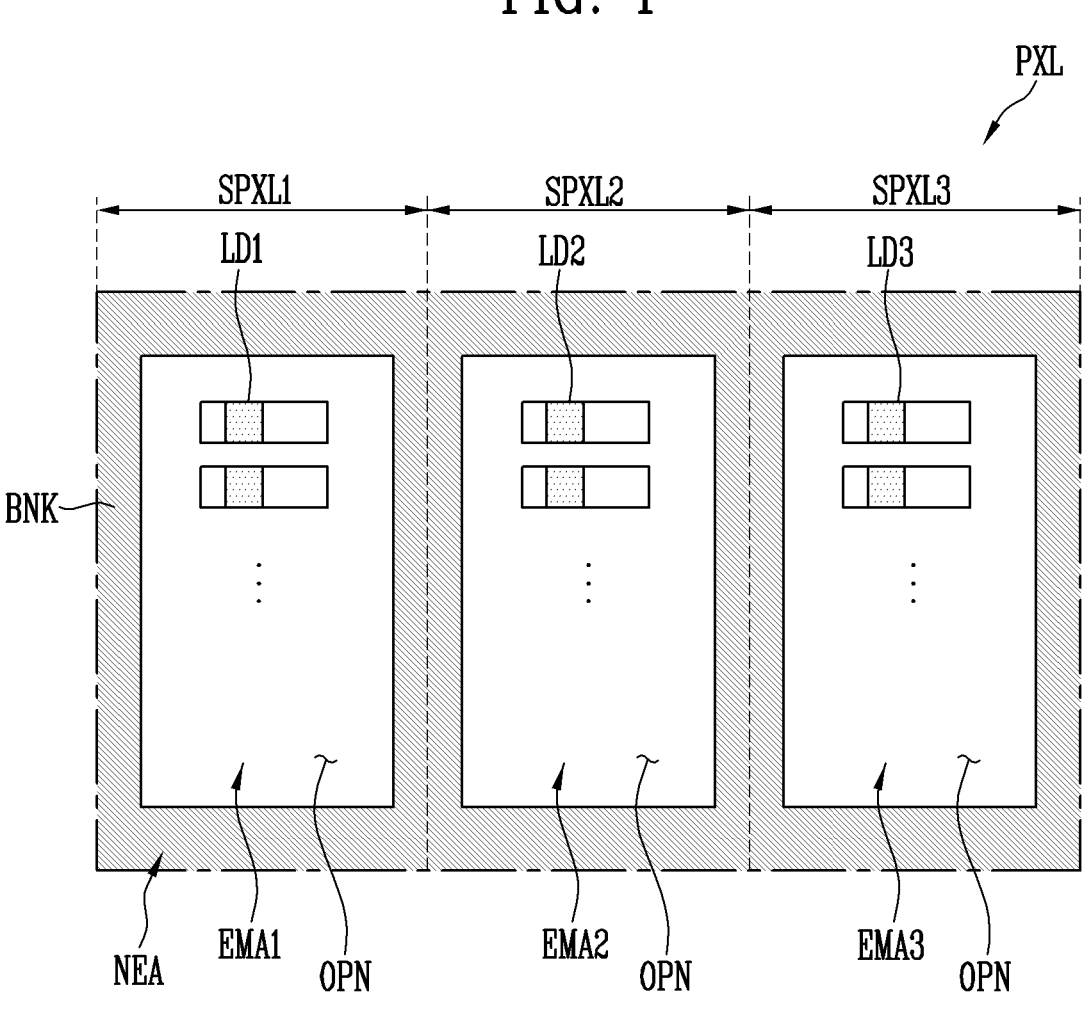
FIG. 4 is a plan view schematically illustrating a pixel according to an embodiment.
Figure 4:
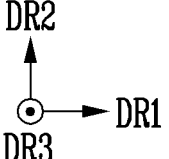
Figure 5:
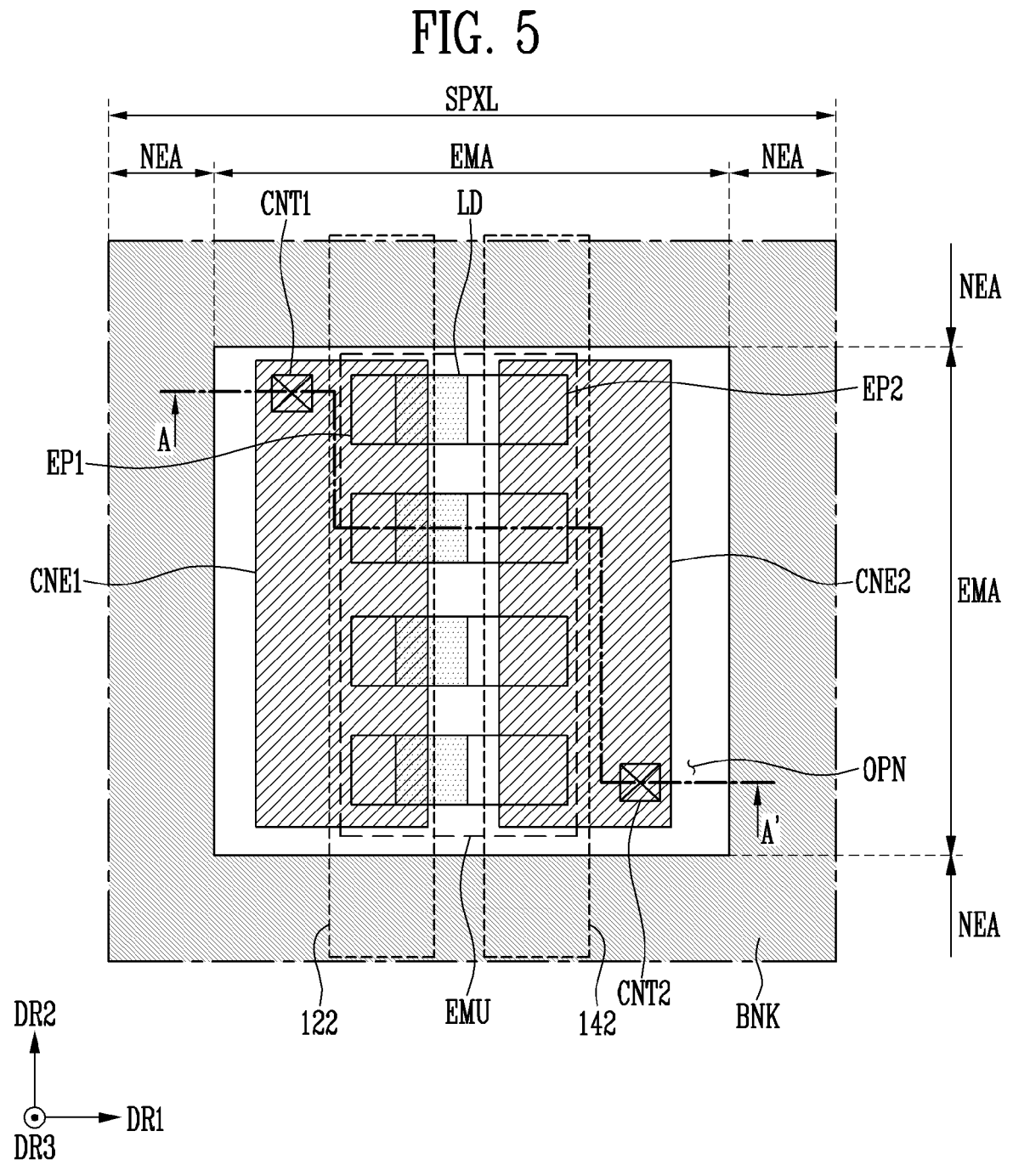
Figure 6:
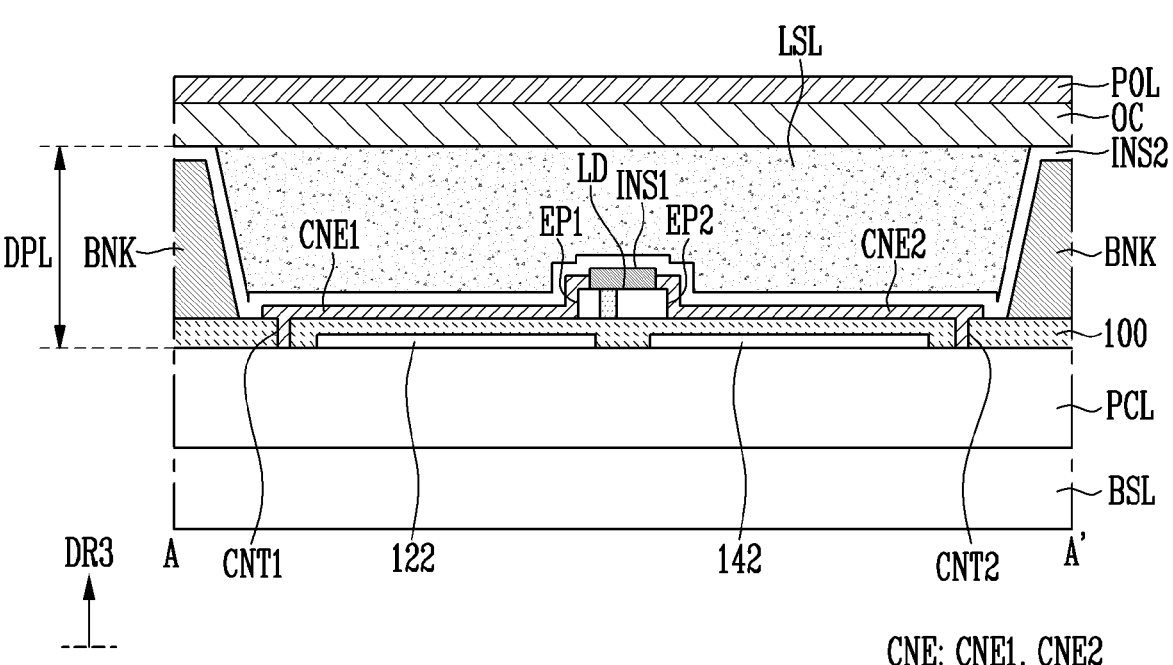
FIG. 6 is a schematic cross-sectional view taken along line A-A' of FIG. 5.

The pixel PXL (or sub-pixel SPXL) according to an embodiment will be described with reference to FIGS. 4 to 6. FIGS. 4 to 6 are schematic diagrams illustrating the pixel PXL (or sub-pixel SPXL) according to an embodiment. Contents that overlap the above-described contents will be briefly described or will not be repeatedly described.

First, a planar structure of the pixel PXL (or sub-pixel SPXL) will be described with reference to FIGS. 4 and 5. FIG. 4 is a plan view schematically illustrating a pixel according to an embodiment. FIG. 5 is a plan view schematically illustrating a sub-pixel according to an embodiment. The sub-pixel SPXL may be one of the first sub-pixel SPXL1, the second sub-pixel SPXL2, and the third sub-pixel SPXL3 described above with reference to FIG. 3.

FIG. 4 shows an embodiment in which the first to third sub-pixels SPXL1, SPXL2, and SPX3 are sequentially arranged. FIG. 5 shows a planar structure of one of the sub-pixels SPXL.

The pixel PXL (or sub-pixel SPXL) may include a bank BNK and light emitting elements LD. According to an embodiment, the pixel PXL (or sub-pixel SPXL) may include an emission area EMA and a non-emission area NEA.

The emission area EMA may overlap an opening OPN defined (formed) by the bank BNK in a plan view. According to an embodiment, the light emitting elements LD may be disposed in emission areas EMA, and light emitted by the light emitting elements LD may be provided in the emission areas EMA. According to an embodiment, the first sub-pixel SPXL1 may include a first emission area EMA1 that is one of the emission areas EMA. The second sub-pixel SPXL2 may include a second emission area EMA2 that is one of the emission areas EMA. The third sub-pixel SPXL3 may include a third emission area EMA3 that is one of the emission areas EMA.

The light emitting elements LD may not be disposed in the non-emission area NEA. The non-emission area NEA may overlap the bank BNK in a plan view.

The bank BNK may form a space. The bank BNK may have a shape that protrudes in a thickness direction (for example, a third direction DR3) of the base layer BSL and may surround a region in a plan view. The space may be a region in which a fluid may be provided. For example, ink INK (refer to FIG. 10) including the light emitting element LD may be provided in the opening OPN defined by the bank BNK, so that the light emitting element LD may be disposed in the emission areas EMA.

According to an embodiment, each of the sub-pixels SPXL may include light emitting elements LD that emit light of a color. For example, the first sub-pixel SPXL1 may include the first light emitting element LD1 emitting light of the first color. The second sub-pixel SPXL2 may include the second light emitting element LD2 emitting light of the second color. The third sub-pixel SPXL3 may include the third light emitting element LD3 emitting light of the third color. Separate color filters or quantum dots may not be required to distinguish the sub-pixels SPXL in this embodiment, and since each of the light emitting elements LD is configured to emit light of one color designated in the sub-pixel SPXL, color reproducibility may be excellent.

According to an embodiment, the sub-pixel SPXL may include channels 122 and 142. The channels 122 and 142 may be spaces (or regions) in which a fluid may be provided. For example, in a process of manufacturing the display device DD, a liquid metal 200 (refer to FIG. 15) may be provided in the channels 122 and 142. According to an embodiment, a first channel 122 may be referred to as a first pixel channel, and a second channel 142 may be referred to as a second pixel channel.

The channels 122 and 142 may be spaced apart from each other. Accordingly, a path region in which the light emitting elements LD are arranged may be defined. For example, the channels 122 and 142 may be spaced apart from each other in a direction from the first end EP1 to the second end EP2 of the light emitting elements LD (for example, a first direction DR1).

The channels 122 and 142 may extend in a direction. For example, the channels 122 and 142 may extend in a direction in which the light emitting elements LD are arranged (for example, a second direction DR2).

The light emitting elements LD may be disposed on the channels 122 and 142. According to an embodiment, portions of the light emitting elements LD may be disposed between the first channel 122 and the second channel 142. The light emitting elements LD may be aligned between the first channel 122 and the second channel 142. The light emitting elements LD may form (or configure) an emission unit EMU. The emission unit EMU may be a unit including the light emitting elements LD adjacent to each other.

The light emitting element LD may be aligned in various ways. For example, FIG. 5 shows an embodiment in which the light emitting elements LD are aligned in parallel between the first channel 122 and the second channel 142. However, the disclosure is not necessarily limited to the above-described embodiment. For example, the light emitting elements LD may be aligned in a series structure or a series/parallel mixed structure, and the number of light emitting elements LD connected in series and/or in parallel is not particularly limited.

According to an embodiment, in a process in which the light emitting elements LD are aligned, the liquid metal 200 to which alignment signals may be supplied may be provided in the channels 122 and 142. For example, a first liquid metal part 222 (refer to FIG. 9) may be provided in the first channel 122, a second liquid metal part 242 (refer to FIG. 9) may be provided in the second channel 142, and the ink INK including the light emitting element LD may be supplied (or provided) to the opening OPN defined by the bank BNK. A first alignment signal may be supplied to the first liquid metal part 222, and a second alignment signal may be supplied to the second liquid metal part 242. The first alignment signal and the second alignment signal may have different waveforms, potentials, and/or phases. For example, the first alignment signal may be an AC signal, and the second alignment signal may be a ground signal. However, the disclosure is not necessarily limited to the above-described embodiment. An electric field may be formed between (or on) the first liquid metal part 222 and the second liquid metal part 242, and the light emitting elements LD may be aligned between the first liquid metal part 222 and the second liquid metal part 242 in response to the electric field. For example, the light emitting elements LD may be moved (or rotated) by a force (for example, a dielectrophoresis (DEP) force) in response to the electric field and aligned in a region. After the light emitting elements LD are aligned, the first liquid metal part 222 and the second liquid metal part 242 may be removed. Accordingly, a structure in which the light emitting elements LD are aligned on the channels 122 and 142 may be formed.

The light emitting element LD may emit light in response to electrical signals. For example, the light emitting element LD may provide light in response to a first electrical signal (for example, an anode signal) provided from a first connection electrode CNE1 and a second electrical signal (for example, a cathode signal) provided from a second connection electrode CNE2.

The first end EP1 of the light emitting element LD may be disposed adjacent to the first channel 122, and the second end EP2 of the light emitting element LD may be disposed adjacent to the second channel 142. The first end EP1 may or may not overlap the first channel 122. The second end EP2 may or may not overlap the second channel 142. The first end EP1 of each of the light emitting elements LD may be electrically connected to the first connection electrode CNE1. The second end EP2 of each of the light emitting elements LD may be electrically connected to the second connection electrode CNE2.

The first connection electrode CNE1 may be disposed on first ends EP1 to be electrically connected to the first ends EP1 of the light emitting elements LD. According to an embodiment, the first connection electrode CNE1 may be electrically connected to another wiring through a first contact portion CNT1. For example, the first connection electrode CNE1 may be electrically connected to one or more of circuit elements through the first contact portion CNT1 to receive the anode signal.

The second connection electrode CNE2 may be disposed on second ends EP2 to be electrically connected to the second ends EP2 of the light emitting elements LD. According to an embodiment, the second connection electrode CNE2 may be electrically connected to another wiring through a second contact portion CNT2. For example, the second connection electrode CNE2 may be electrically connected to a power source line supplying power through the second contact portion CNT2 to receive the cathode signal.

A cross-sectional structure of the sub-pixel SPXL according to an embodiment will be described with reference to FIG. 6. FIG. 6 is a schematic cross-sectional view taken along line A-A' of FIG. 5. Contents that overlap the above-described contents will be briefly described or will not be repeatedly described.

Referring to FIG. 6, the sub-pixel SPXL may be disposed on the base layer BSL. The sub-pixel SPXL may include a pixel circuit layer PCL and a display element layer DPL.

The base layer BSL may form a base member on which the sub-pixel SPXL is to be formed. The base layer BSL may provide an area in which the pixel circuit layer PCL and the display element layer DPL are to be disposed.

The pixel circuit layer PCL may be disposed on the base layer BSL. The pixel circuit layer PCL may include circuit elements (for example, a transistor and the like), wirings, and multiple insulating layers. The transistor may be a thin film transistor. According to an embodiment, the transistor may be a driving transistor. At least one of the insulating layers may be disposed on the transistor and the wirings. A structure of the pixel circuit layer PCL is not limited to a specific embodiment and may include various structures.

The display element layer DPL may be disposed on the pixel circuit layer PCL. The display element layer DPL may include the channels 122 and 142, a channel formation pattern 100, the bank BNK, the light emitting element LD, a first insulating layer INS1, connection electrodes CNE, a second insulating layer INS2, and a scattering layer LSL.

The channels 122 and 142 may be formed on the pixel circuit layer PCL. According to an embodiment, the pixel circuit layer PCL may include a via layer formed closest to the display element layer DPL. The channels 122 and 142 may be provided on the via layer. For example, the channels 122 and 142 may be surrounded by the via layer and the channel formation pattern 100.

The channels 122 and 142 may be defined by the channel formation pattern 100. The channels 122 and 142 may be regions surrounded by the channel formation pattern 100. For example, the channel formation pattern 100 may include multiple grooves, and the channels 122 and 142 may be formed between regions corresponding to the grooves of the channel formation pattern 100 and the upper surface (for example, the via layer including an organic material) of the pixel circuit layer PCL.

The channels 122 and 142 may be separated from each other with a region interposed therebetween. For example, at least a portion of the channel formation pattern 100 may be disposed between the channels 122 and 142. Accordingly, the channels 122 and 142 may be fluidically separated from each other.

The channels 122 and 142 may have a generally flat shape. For example, the channels 122 and 142 may extend parallel to the base layer BSL. According to an embodiment, the channels 122 and 142 may not overlap contact portions CNT1 and CNT2 for electrically connecting the connection electrodes CNE to other wirings in a plan view.

According to an embodiment, the channels 122 and 142 may be hollows sealed by other components. The channels 122 and 142 may be defined by the channel formation pattern 100 without a conductive (or reflective) pattern directly adjacent thereto. According to an embodiment, by providing the channels 122 and 142 having a structure including the hollows, the display device DD may be robust against external impact. According to an embodiment, in case that the display device DD is manufactured as a flexible device and at least a portion of the display device DD is bent, the channels 122 and 142 may relieve strain due to the bending.

The channel formation pattern 100 may be disposed on the pixel circuit layer PCL. The channel formation pattern 100 may be disposed on the channels 122 and 142. The channel formation pattern 100 may be spaced apart from the pixel circuit layer PCL in a region the channels 122 and 142 are formed, and may be in contact with the pixel circuit layer PCL in a region the channels 122 and 142 are not formed.

The channel formation pattern 100 may form the channels 122 and 142. As described above, the channel formation pattern 100 may include grooves for defining the channels 122 and 142, and may define regions corresponding to the grooves as the channels 122 and 142.

The channel formation pattern 100 may include a polymer. For example, the channel formation pattern 100 may include an insulating polymer. According to an embodiment, the channel formation pattern 100 may include polydimethylsiloxane (PDMS). In another embodiment, the channel formation pattern 100 may include a silicone such as ecoflex or dragon skin. However, the disclosure is not necessarily limited to the above-described examples.

According to an embodiment, the channel formation pattern 100 may include an insulating material having a dielectric constant. Accordingly, in case that the first liquid metal part 222 is supplied to the first channel 122 and the second liquid metal part 242 is supplied to the second channel 142, since the channel formation pattern 100 covers the first liquid metal part 222 and the second liquid metal part 242, an electric field may be appropriately formed between the first liquid metal part 222 and the second liquid metal part 242. For example, according to an embodiment, a separate insulating layer having a dielectric constant may not be additionally required under the light emitting element LD.

According to an embodiment, the channel formation pattern 100 may be manufactured by patterning a polymer on a wafer. For example, a photolithography process for forming micro-channels may be performed on the wafer and the polymer may be deposited. The polymer may be patterned to correspond to the patterned micro-channels, and the channel formation pattern 100 including the grooves may be manufactured as described above.

Holes for forming the first and second contact portions CNT1 and CNT2 may be formed in the channel formation pattern 100.

The bank BNK may be disposed on the channel formation pattern 100. The bank BNK may have a protruding shape and may form a space for accommodating a fluid. The bank BNK may include an organic material such as an acrylates resin, an epoxy resin, a phenolic resin, a polyamides resin, a polyimides resin, a polyesters resin, a polyphenylenesulfides resin, benzocyclobutene BCB, or the like. However, the disclosure is not necessarily limited thereto.

The light emitting element LD may be disposed on the channel formation pattern 100. According to an embodiment, the light emitting element LD may emit light in response to the electrical signals (for example, the anode signal and the cathode signal) provided from the first connection electrode CNE1 and the second connection electrode CNE2.

The light emitting element LD may be disposed in a region surrounded by the bank BNK. The light emitting element LD may be disposed between the first channel 122 and the second channel 142 in a plan view.

The first insulating layer INS1 may be disposed on the light emitting element LD. The first insulating layer INS1 may cover the active layer AL of the light emitting element LD.

The first insulating layer INS1 may expose at least a portion of the light emitting element LD. For example, the first insulating layer INS1 may not cover the first end EP1 and the second end EP2 of the light emitting element LD. Accordingly, the first end EP1 and the second end EP2 of the light emitting element LD may be exposed, and may be electrically connected to the first connection electrode CNE1 and the second connection electrode CNE2, respectively.

As the first insulating layer INS1 is formed on the light emitting elements LD after the light emitting elements LD are aligned, it may prevent the light emitting elements LD from being separated from the aligned positions.

The first insulating layer INS1 may have a single-layer or multi-layer structure. The first insulating layer INS1 may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). However, the disclosure is not limited to the above-described examples.

The connection electrodes CNE may be disposed on the channel formation pattern 100 and the first insulating layer INS1. The first connection electrode CNE1 may be electrically connected to the first end EP1 of the light emitting element LD. The second connection electrode CNE2 may be electrically connected to the second end EP2 of the light emitting element LD.

The connection electrodes CNE may be electrically connected to other wirings formed in the pixel circuit layer PCL through the contact portions CNT1 and CNT2, respectively. Positions of the first contact portion CNT1 and the second contact portion CNT2 are not particularly limited.

The connection electrodes CNE may include a transparent conductive material. For example, the first connection electrode CNE1 and the second connection electrode CNE2 may include at least one selected from the group consisting of indium tin oxide (ITO), indium zinc oxide (IZO), and indium tin zinc oxide (ITZO). Accordingly, light emitted from the light emitting elements LD may pass through the connection electrodes CNE to be emitted to outside of the display device DD. However, the disclosure is not necessarily limited to the above-described examples.

According to an embodiment, the first connection electrode CNE1 and the second connection electrode CNE2 may be patterned at the same time in a same process. However, the disclosure is not necessarily limited to the above-described examples. After one of the first connection electrode CNE1 and the second connection electrode CNE2 is patterned, another one of the first connection electrode CNE1 and the second connection electrode CNE2 may be patterned.

The second insulating layer INS2 may be disposed on the first and second connection electrodes CNE1 and CNE2 and the first insulating layer INS1. The second insulating layer INS2 may protect components of the display element layer DPL from external influences.

The second insulating layer INS2 may have a single-layer or multi-layer structure. The second insulating layer INS2 may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The scattering layer LSL may be disposed on the light emitting element LD (or the first insulating layer INS1). The scattering layer LSL may be formed to efficiently use the light emitted by the light emitting element LD. For example, the scattering layer LSL may include scatterers. According to an embodiment, the scatterers may include at least one selected from the group consisting of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). However, the disclosure is not necessarily limited to the above-described examples.

According to an embodiment, the sub-pixel SPXL may include an overcoat layer OC and an outer film layer POL.

The overcoat layer OC may be disposed on the scattering layer LSL. The overcoat layer OC may be provided over the first sub-pixel SPXL1, the second sub-pixel SPXL2, and the third sub-pixel SPXL3. The overcoat layer OC may cover a lower member including the display element layer DPL. The overcoat layer OC may prevent moisture or air from penetrating into the above-described lower member. The overcoat layer OC may protect the above-described lower member from foreign substances such as dust.

The overcoat layer OC may include an organic material such as an acrylic resin, an epoxy resin, a phenolic resin, a polyamide resin, a polyimide resin, a polyester resin, a polyphenylenesulfide resin, or benzocyclobutene (BCB). However, the disclosure is not necessarily limited thereto, and the overcoat layer OC may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The outer film layer POL may be disposed on the overcoat layer OC. The outer film layer POL may be disposed on the upper portion of the display device DD to reduce external influences. The outer film layer POL may be provided over the first sub-pixel SPXL1, the second sub-pixel SPXL2, and the third sub-pixel SPXL3. According to an embodiment, the outer film layer POL may include one of a polyethyleneterephthalate (PET) film, a low reflection film, a polarizing film, and a transmittance controllable film, but the disclosure is not necessarily limited thereto. According to an embodiment, the sub-pixel SPXL may include an upper substrate instead of the outer film layer POL.

Hereinafter, a method of manufacturing the display device DD according to an embodiment will be described with reference to FIGS. 7 to 19. Contents that overlap the above-described contents will be briefly described or will not be repeatedly described.

FIG. 7 is a flowchart of a method of manufacturing a display device according to an embodiment.

FIGS. 8 to 13 are schematic cross-sectional views schematically illustrating the method of manufacturing the display device according to an embodiment. FIGS. 8 to 13 shows a method of manufacturing a structure described above with reference to FIG. 6.

FIGS. 14 to 19 are plan views schematically illustrating the method of manufacturing the display device according to an embodiment. FIGS. 14 to 19 shows an embodiment in which a light emitting panel is formed on a mother substrate 1. According to an embodiment, after multiple light emitting panels are formed on the mother substrate 1, the light emitting panels may be separated from each other through a separate cutting process (for example, a scribing process). However, for convenience of description, in FIGS. 14 to 19, only a single light emitting panel is shown on the mother substrate 1. A person skilled in the art will clearly understand that the method of manufacturing the display device DD according to the embodiments includes an embodiment in which light emitting panels are formed on the mother substrate 1.

Referring to FIG. 7, the method of manufacturing the display device DD according to an embodiment may include disposing a channel formation pattern on a base layer (S110), supplying a liquid metal (S120), disposing light emitting elements (S130), removing the liquid metal (S140), disposing an insulating layer (S150), and disposing a connection electrode (S160).

Figure 8:
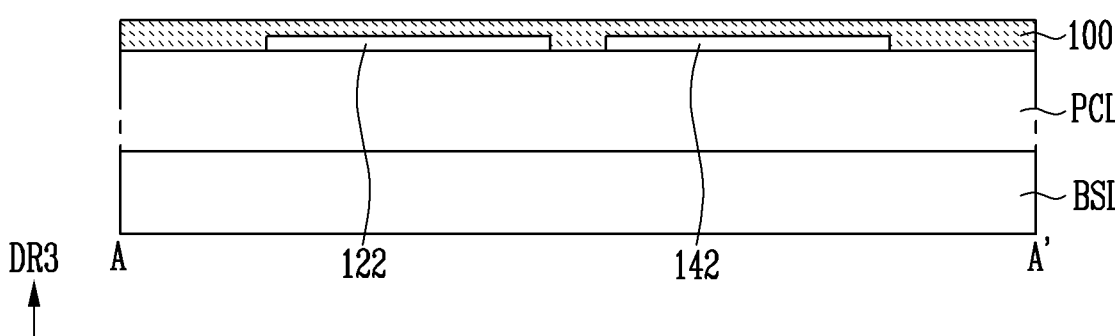
FIGS. 8 to 13 are schematic cross-sectional views schematically illustrating the method of manufacturing the display device according to an embodiment.
Figure 14:
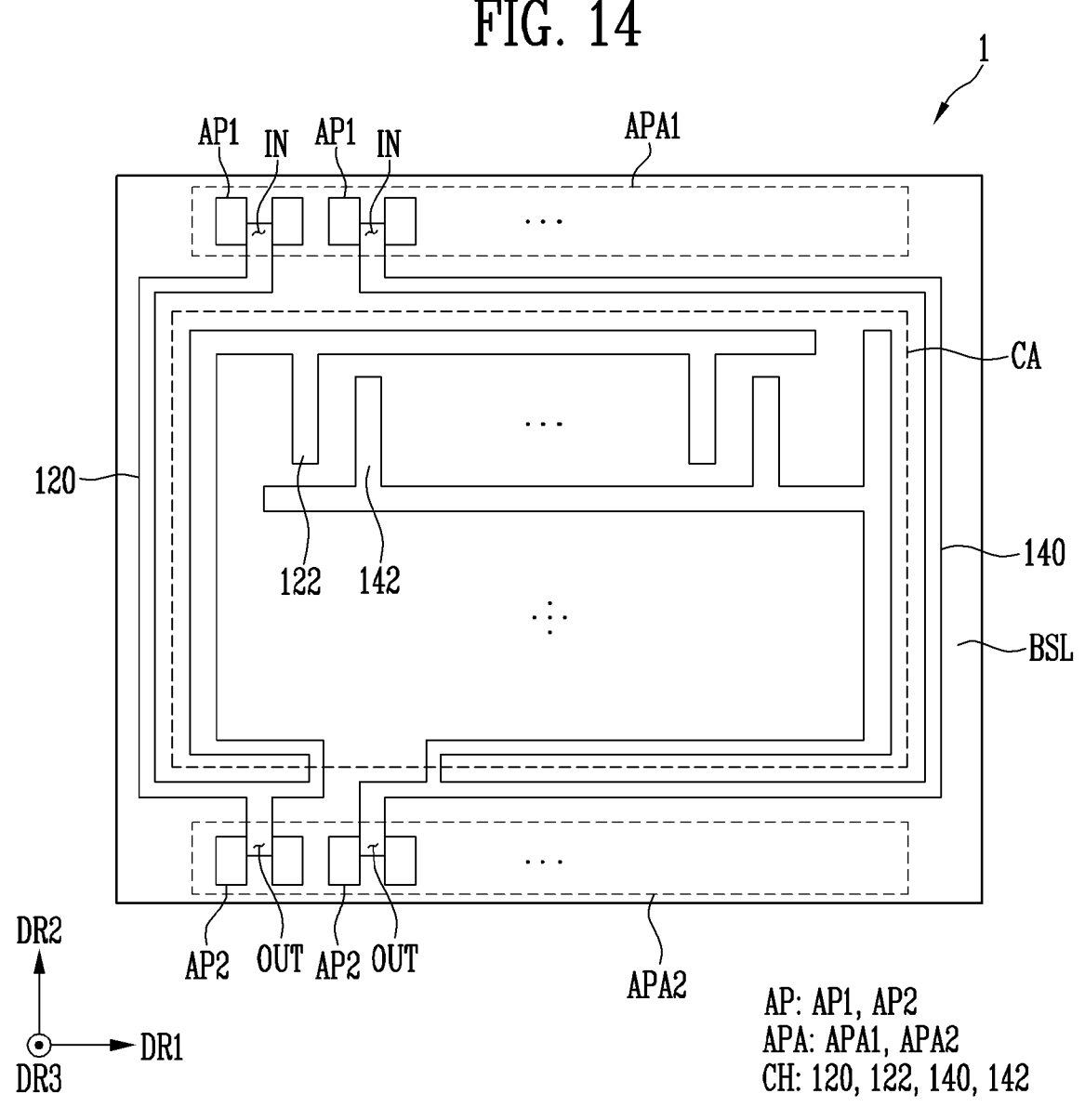
FIGS. 14 to 19 are plan views schematically illustrating the method of manufacturing the display device according to an embodiment.

Referring to FIGS. 7, 8, and 14, in the disposing of the channel formation pattern on the base layer (S110), the channel formation pattern 100 may be provided on the base layer BSL.

The pixel circuit layer PCL may be disposed on the base layer BSL of the mother substrate 1, and the channel formation pattern 100 may be disposed on the pixel circuit layer PCL. Components (for example, the pixel circuit layer PCL and the like) disposed on the base layer BSL may be formed by patterning a conductive layer (or a metal layer), an inorganic material layer, an organic material layer, or the like by a conventional process using a mask.

According to an embodiment, the mother substrate 1 may be a panel for manufacturing a display device. A cell area CA formed on the mother substrate 1 may be an area for forming the light emitting panel, and the cell area CA may be separated from the mother substrate 1 to configure an individual display device DD. For example, the cell area CA may be an area to be separated in a subsequent process, and may be an area in which the light emitting elements LD are provided.

The channel formation pattern 100 may form channels CH. For example, the channels CH may include the first channel 122, the second channel 142, a first outer channel 120, and a second outer channel 140. In FIG. 14, positions/ paths where the channels CH are formed are illustrated so that components can be clearly shown.

According to an embodiment, the first channel 122 and the second channel 142 may be spaced apart from each other in a direction to form the path region in which the light emitting elements LD are arranged.

According to an embodiment, an alignment pad area APA in which alignment pads AP are disposed may be formed on the mother substrate 1. The alignment pads AP may include a first alignment pad AP1 and a second alignment pad AP2. For example, a first alignment pad area APA1 in which the first alignment pad AP1 is disposed and a second alignment pad area APA2 in which the second alignment pad AP2 is disposed may be formed on the mother substrate 1. The first alignment pad area APA1 may be an area disposed on a side of the mother substrate 1, and may correspond to an area in which an inlet portion IN of the channel CH is formed. The second alignment pad area APA2 may be an area disposed on another side of the mother substrate 1, and may correspond to an area in which an outlet portion OUT of the channel CH is formed.

According to an embodiment, the first outer channel 120 and the second outer channel 140 may be disposed outside the cell area CA. For example, the first outer channel 120 may be disposed to surround at least a portion of the cell area CA. An end of the first outer channel 120 may extend adjacent to the first alignment pad AP1, and another end of the first outer channel 120 may extend adjacent to the second alignment pad AP2. The second outer channel 140 may be disposed to surround at least a portion of the cell area CA. An end of the second outer channel 140 may extend adjacent to the first alignment pad AP1, and another end of the second outer channel 140 may extend adjacent to the second alignment pad AP2. According to an embodiment, the end of each of the first outer channel 120 and the second outer channel 140 may be disposed between multiple first alignment pads AP1, and the another end of each of the first outer channel 120 and the second outer channel 140 may be disposed between multiple second alignment pads AP2.

According to an embodiment, the inlet portion IN to which the liquid metal 200 may be supplied may be formed at the end of each of the first outer channel 120 and the second outer channel 140. According to an embodiment, the inlet portion IN may be disposed on a side of the mother substrate 1. The inlet portion IN may include a region exposed to outside, and the first outer channel 120 and the second outer channel 140 may be fluidly connected to the outside through the inlet portion IN.

According to an embodiment, the outlet portion OUT to which the liquid metal 200 may be discharged may be formed at the another end of each of the first outer channel 120 and the second outer channel 140. The outlet portion OUT may be disposed on another side of the mother substrate 1. The outlet portion OUT may include a region exposed to the outside, and the first outer channel 120 and the second outer channel 140 may be fluidly connected to the outside through the outlet portion OUT.

According to an embodiment, in case that the liquid metal 200 is supplied to the first outer channel 120, at least a portion of the liquid metal 200 in the first outer channel 120 may be electrically connected to the first alignment pad AP1, and at least another portion of the liquid metal 200 in the first outer channel 120 may be electrically connected to the second alignment pad AP2.

According to an embodiment, in case that the liquid metal 200 is supplied to the second outer channel 140, at least a portion of the liquid metal 200 in the second outer channel 140 may be electrically connected to the first alignment pad AP1, and at least another portion of the liquid metal 200 in the second outer channel 140 may be electrically connected to the second alignment pad AP2.

According to an embodiment, the first outer channel 120 may be fluidly connected to the first channel 122 of each cell. For example, the liquid metal 200 supplied through the inlet portion IN of the first outer channel 120 may be supplied to the first channel 122.

According to an embodiment, the second outer channel 140 may be fluidly connected to the second channel 142 of each cell. For example, the liquid metal 200 supplied through the inlet portion IN of the second outer channel 140 may be supplied to the second channel 142.

According to an embodiment, the first outer channel 120 and the second outer channel 140 may be fluidly separated from each other. The outer channels 120 and 140 may be separated to supply different alignment signals to the liquid metal 200 in the first outer channel 120 and the liquid metal 200 in the second outer channel 140 after the liquid metal 200 is supplied to each of the first and second outer channels 120 and 140.

According to an embodiment, the first alignment pad AP1 and the second alignment pad AP2 may be components for supplying the first alignment signal and the second alignment signal, respectively, and may include a conductive structure. For example, each of the first alignment pad AP1 and the second alignment pad AP2 may include multiple conductive layers including a conductive material capable of being electrically connected to other components. According to an embodiment, a portion of the first alignment pads AP1 and a portion of the second alignment pads AP2 adjacent to the first outer channel 120 may receive the first alignment signal (for example, the AC signal). A portion of the first alignment pads AP1 and a portion of the second alignment pads AP2 adjacent to the second outer channel 140 may receive the second alignment signal (for example, the ground signal).

Figure 9:
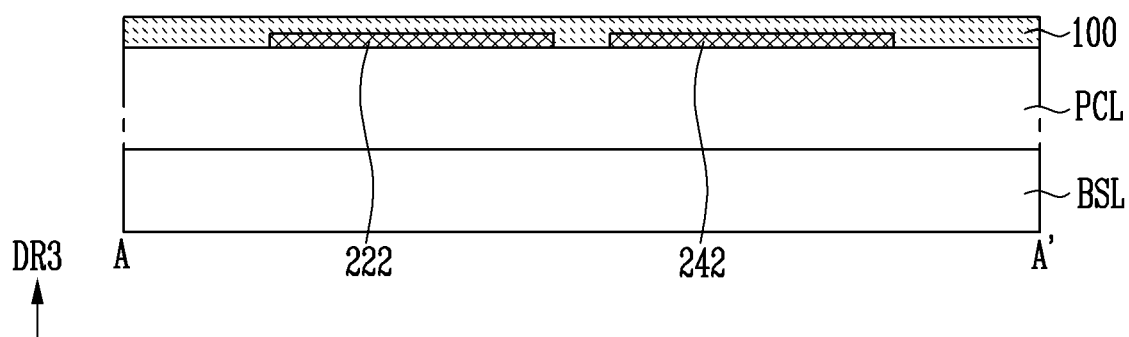
Figure 15:
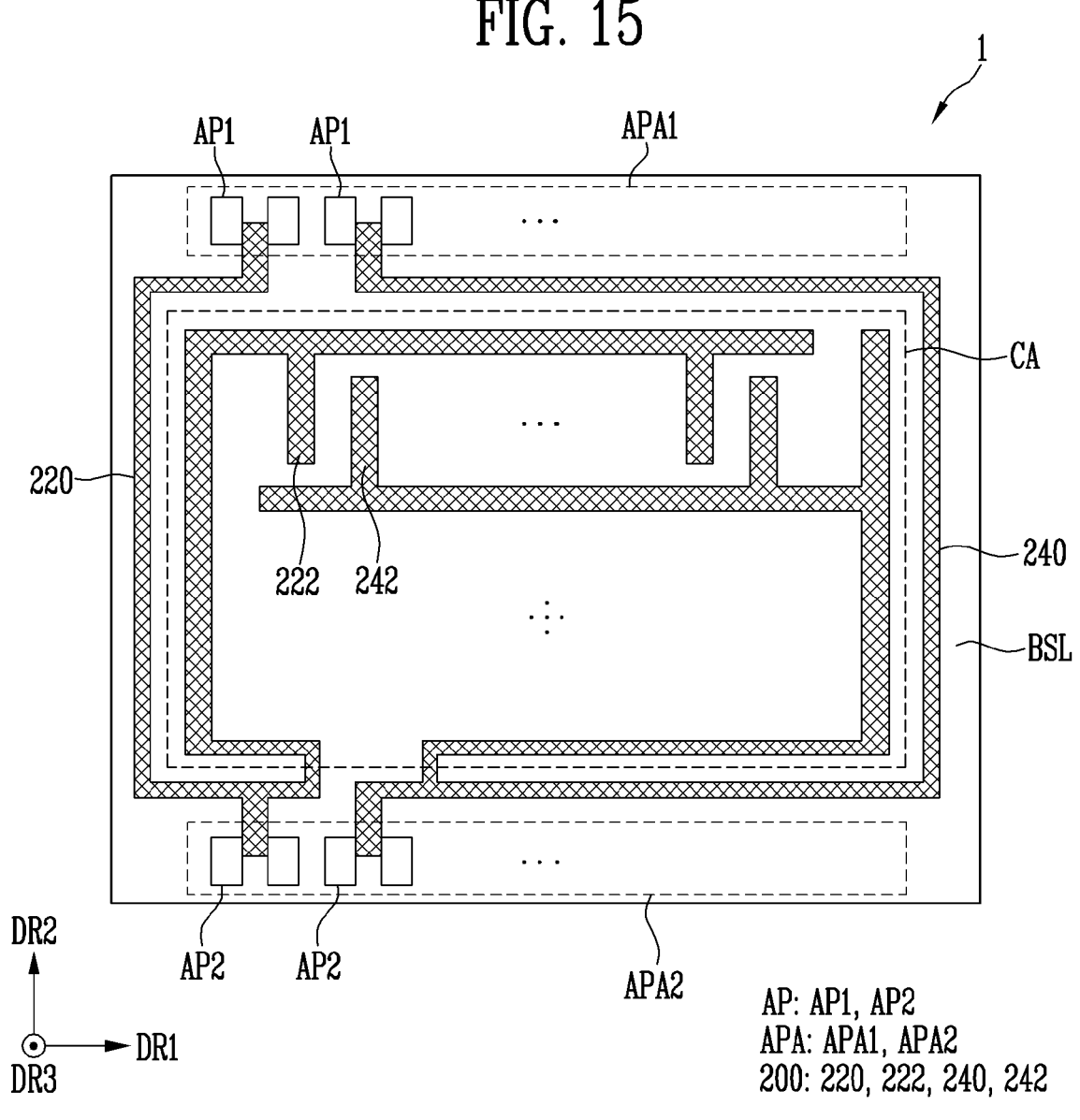

Referring to FIGS. 7, 9, and 15, in the supplying of the liquid metal (S120), the liquid metal 200 may be supplied to the channels CH.

The liquid metal 200 may be supplied to the inlet portions IN, and the liquid metal 200 may be provided to the channels CH fluidly connected to each other. The liquid metal 200 may fill the channels CH fluidly connected to each other. Accordingly, the liquid metal 200 may be patterned to correspond to the channels CH, and an electrical path corresponding to the positions of the channels CH may be form. The method in which the liquid metal 200 is supplied to the channels CH is not particularly limited. For example, the liquid metal 200 may be supplied to the channels CH by a pump or the like.

According to an embodiment, the liquid metal 200 may be in a liquid phase, and may include a metal having an electrical conductivity. For example, the liquid metal 200 may include a eutectic gallium-indium alloy (EGaIn) or a gallium-indium-tin alloy (Galinstan). However, the disclosure is not limited thereto. According to an embodiment, the liquid metal 200 may have an electrical conductivity of greater than or equal to about $3 \times 10^4$ S/cm. Accordingly, in a subsequent process, a metal line corresponding to the liquid metal 200 may be appropriately applied with an alignment signal.

According to an embodiment, the liquid metal 200 may be provided to the first outer channel 120 to form a first outer liquid metal part 220. The liquid metal 200 may be provided to the second outer channel 140 to form a second outer liquid metal part 240. The liquid metal 200 may be provided to the first channel 122 to form a first liquid metal part 222. The liquid metal 200 may be provided to the second channel 142 to form a second liquid metal part 242.

According to an embodiment, each end of the first outer channel 120 may extend adjacent to the first alignment pad AP1 and the second alignment pad AP2, respectively, and the first outer channel 120 may be fluidly connected to the first channel 122. Therefore, the first outer liquid metal part 220 may electrically connect the first liquid metal part 222 to the first alignment pad AP1 and the second alignment pad AP2.

According to an embodiment, each end of the second outer channel 140 may extend adjacent to the first alignment pad AP1 and the second alignment pad AP2, respectively, and the second outer channel 140 may be fluidly connected to the second channel 142. Therefore, the second outer liquid metal part 240 may electrically connect the second liquid metal part 242 to the first alignment pad AP1 and the second alignment pad AP2.

The first liquid metal part 222 and the second liquid metal part 242 may be spaced apart from each other in a direction to define the path region in which the light emitting elements LD are arranged. Accordingly, the first liquid metal part 222 and the second liquid metal part 242 may be physically and electrically separated from each other, so that different electrical signals may be appropriately supplied.

Figure 10:
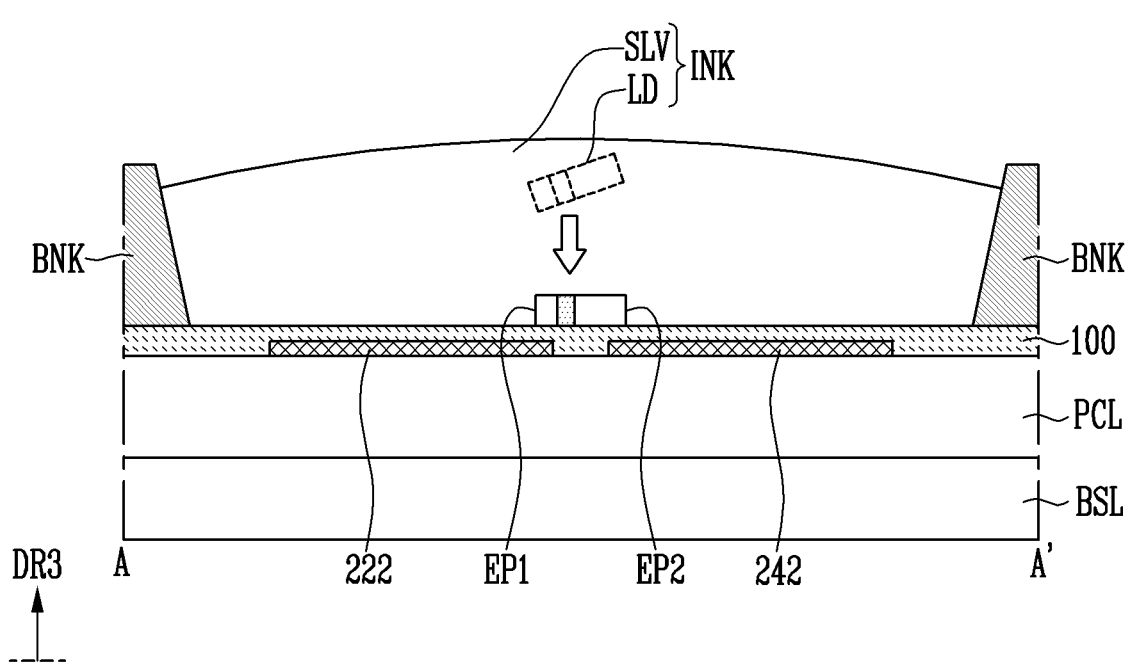
Figure 16:
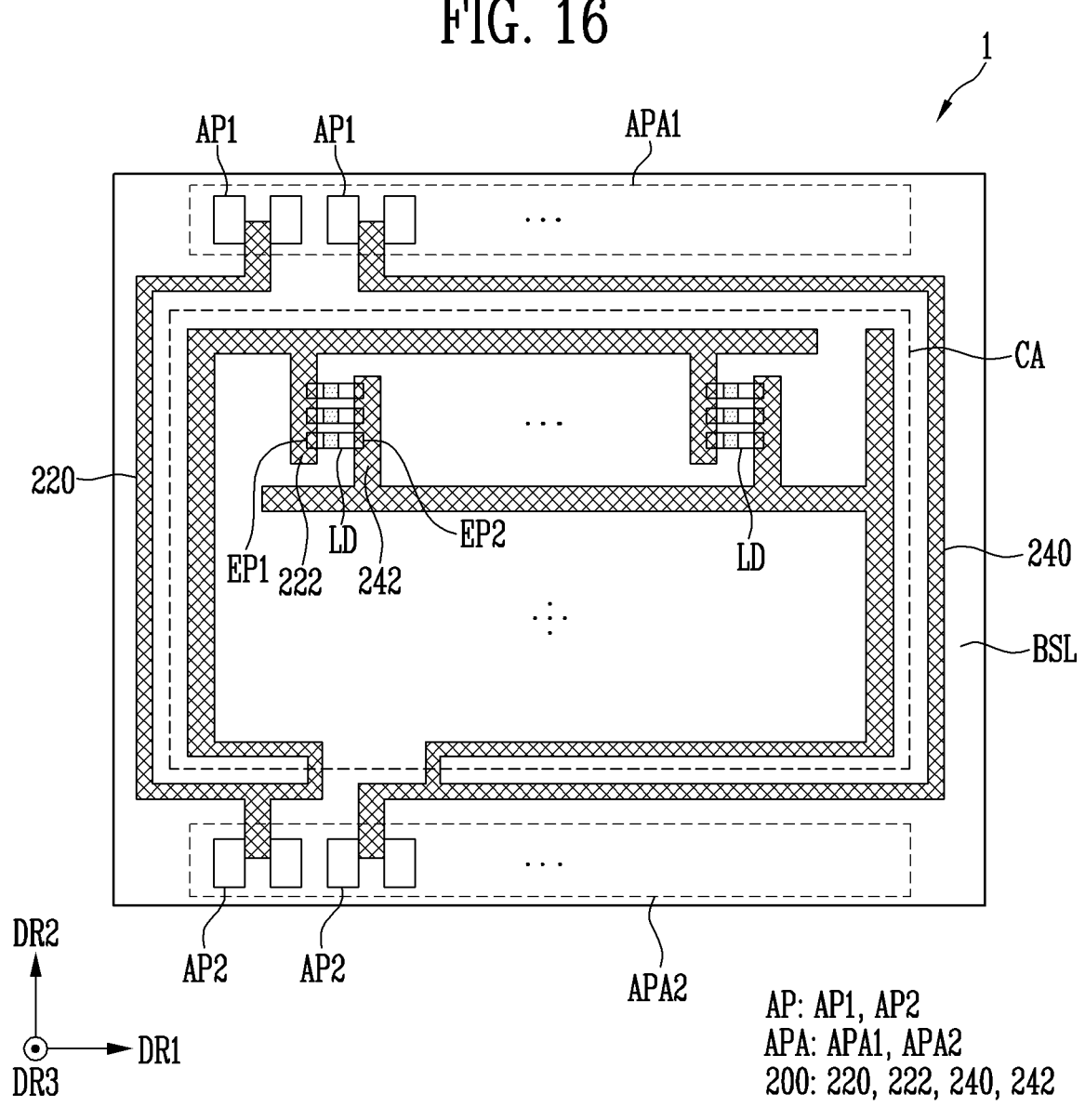

Referring to FIGS. 7, 10, and 16, in the disposing of the light emitting elements (S130), the bank BNK may be patterned on the channel formation pattern 100, and the light emitting elements LD may be aligned between the first liquid metal part 222 and the second liquid metal part 242 in a region surrounded by the bank BNK.

The ink INK including the light emitting elements LD may be supplied to a space defined by the bank BNK and in which a fluid may be provided. For example, the ink INK including the light emitting elements LD and a solvent SLV may be supplied on the base layer BSL of the cell area CA by a printing device configured to spray fluid. According to an embodiment, the solvent SLV may be an organic solvent. For example, the solvent SLV may be one of Propylene Glycol Methyl Ether Acetate (PGMEA), Dipropylen Glycol n-Propyl Ether (DGPE), and Triethylene Gylcol n-Butyl Ether (TGBE). However, the disclosure is not limited to the above-described examples.

The ink INK may be provided in the space defined by the bank BNK, and the alignment signals may be supplied to the liquid metal 200. The light emitting elements LD may be aligned in response to an electric field by the alignment signals. According to an embodiment, the first end EP1 of the light emitting element LD may face the first liquid metal part 222, and the second end EP2 of the light emitting element LD may face the second liquid metal part 242.

The first alignment signal may be supplied to the first and second alignment pads AP1 and AP2 electrically connected to the first outer liquid metal part 220, and the second alignment signal may be supplied to the first and second alignment pads AP1 and AP2 electrically connected to the second outer liquid metal part 240. For example, the alignment signals may be supplied to the first and second alignment pads AP1 and AP2 through pogo pins, respectively. Accordingly, the first alignment signal may be supplied to the first liquid metal part 222, and the second alignment signal may be supplied to the second liquid metal part 242, so that the light emitting elements LD may be aligned between the first liquid metal part 222 and the second liquid metal part 242. Thereafter, the solvent SLV may be removed.

Figure 11:
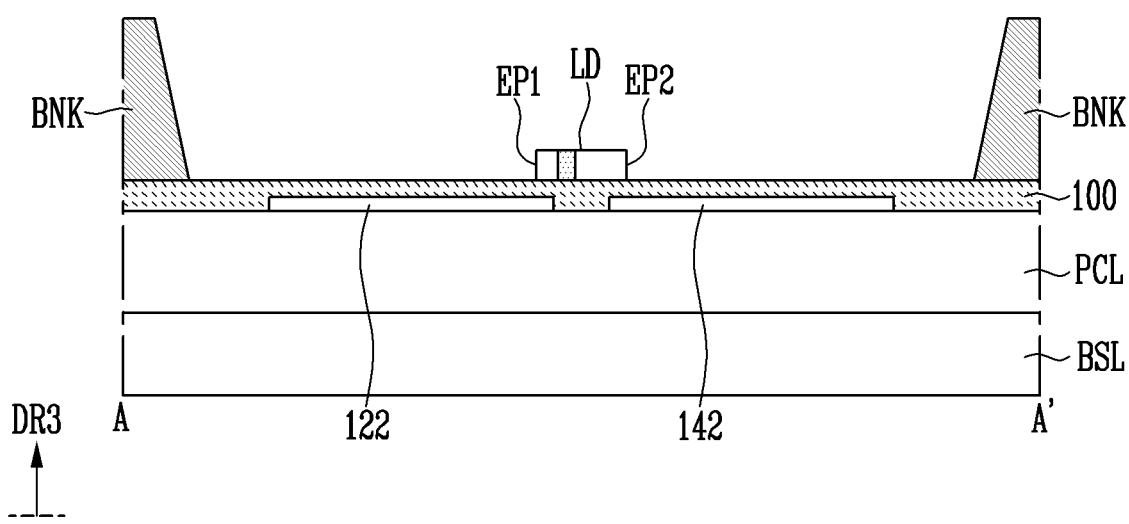
Figure 17:
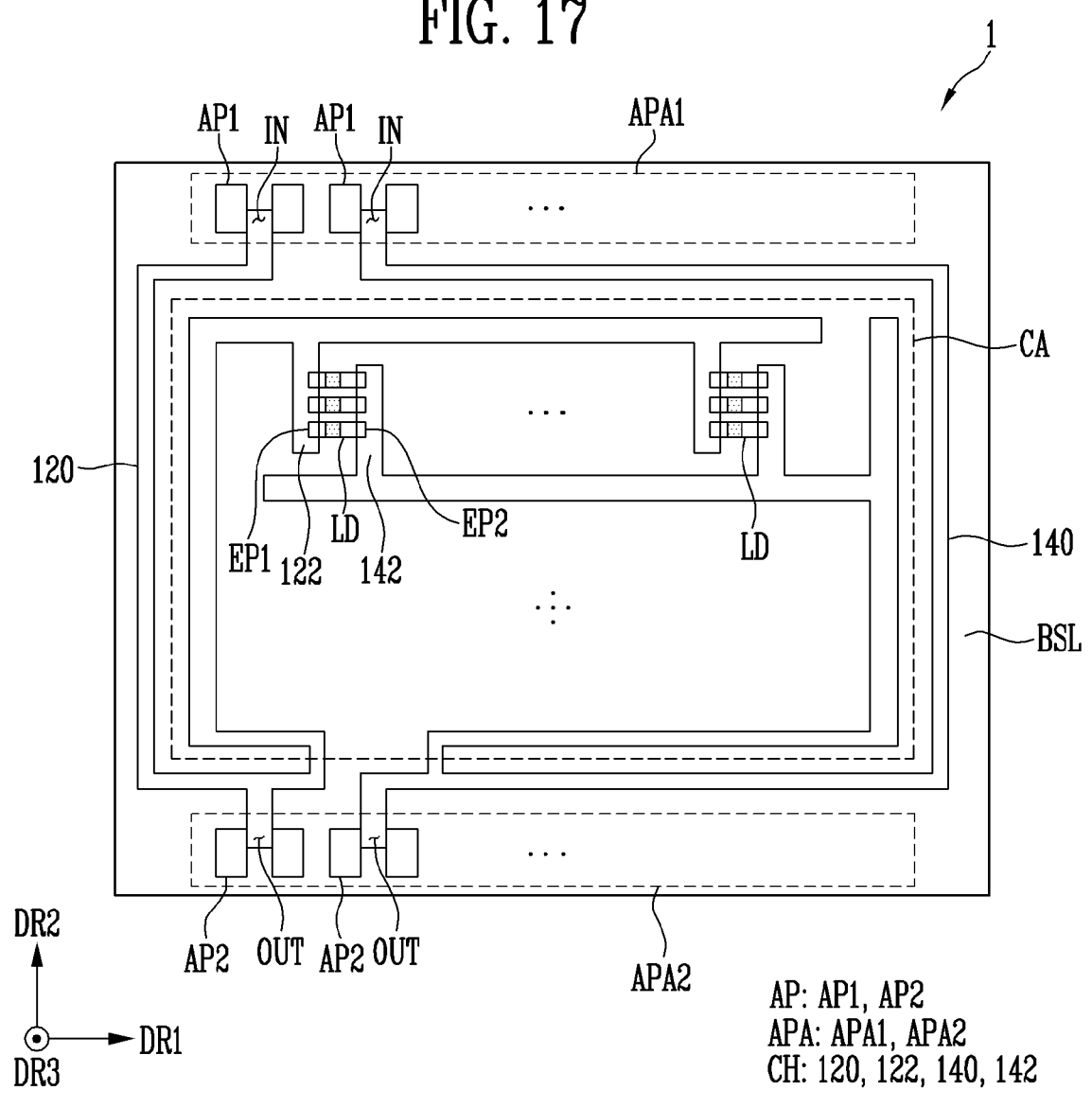

Referring to FIGS. 7, 11, and 17, in the removing of the liquid metal (S140), the liquid metal 200 provided in the channels CH may be removed.

The liquid metal 200 may be removed through the outlet portion OUT. Accordingly, the liquid metal 200 provided throughout the channels CH may be discharged to the outside. Accordingly, the electrical path of the liquid metal 200 formed in the channels CH may be removed. According to an embodiment, the liquid metal 200 may be removed by a pump or the like, but the method in which the liquid metal 200 is removed from the channels CH is not particularly limited.

As the process is performed, the channels CH forming the hollows may be formed again by removing the liquid metal 200. For example, in a state in which the light emitting elements LD are aligned, the first and second channels 122 and 142 and the first and second outer channels 120 and 140 may be formed.

According to an embodiment, conductive patterns for aligning the light emitting elements LD may be removed after the light emitting elements LD are aligned. Experimentally, electrodes for aligning the light emitting elements LD may have reflectivity. There may be a risk that the electrodes for aligning the light emitting elements LD excessively reflect light (for example, external light). For example, in case that a pixel PXL does not include a color filter, a large amount of light may be applied from the outside to a stacked structure of the pixel PXL and, the electrodes for aligning the light emitting elements LD may reflect external light, so that visibility of the display device DD may be reduced. However, according to the embodiments, the liquid metal 200 configured to receive the alignment signals for aligning the light emitting elements LD may be removed after the light emitting elements LD are aligned. Accordingly, the visibility issue caused by lower electrodes of the light emitting elements LD can be resolved. For example, according to the embodiments, even in case that the pixel PXL does not include a color filter, a reflection risk due to the external light can be substantially eliminated.

Figure 12:
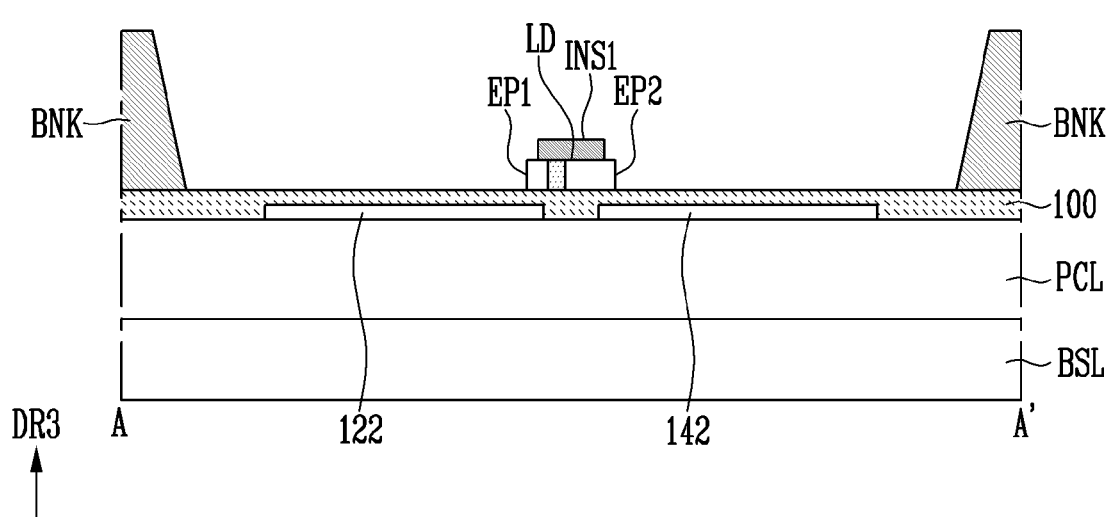
Figure 18:
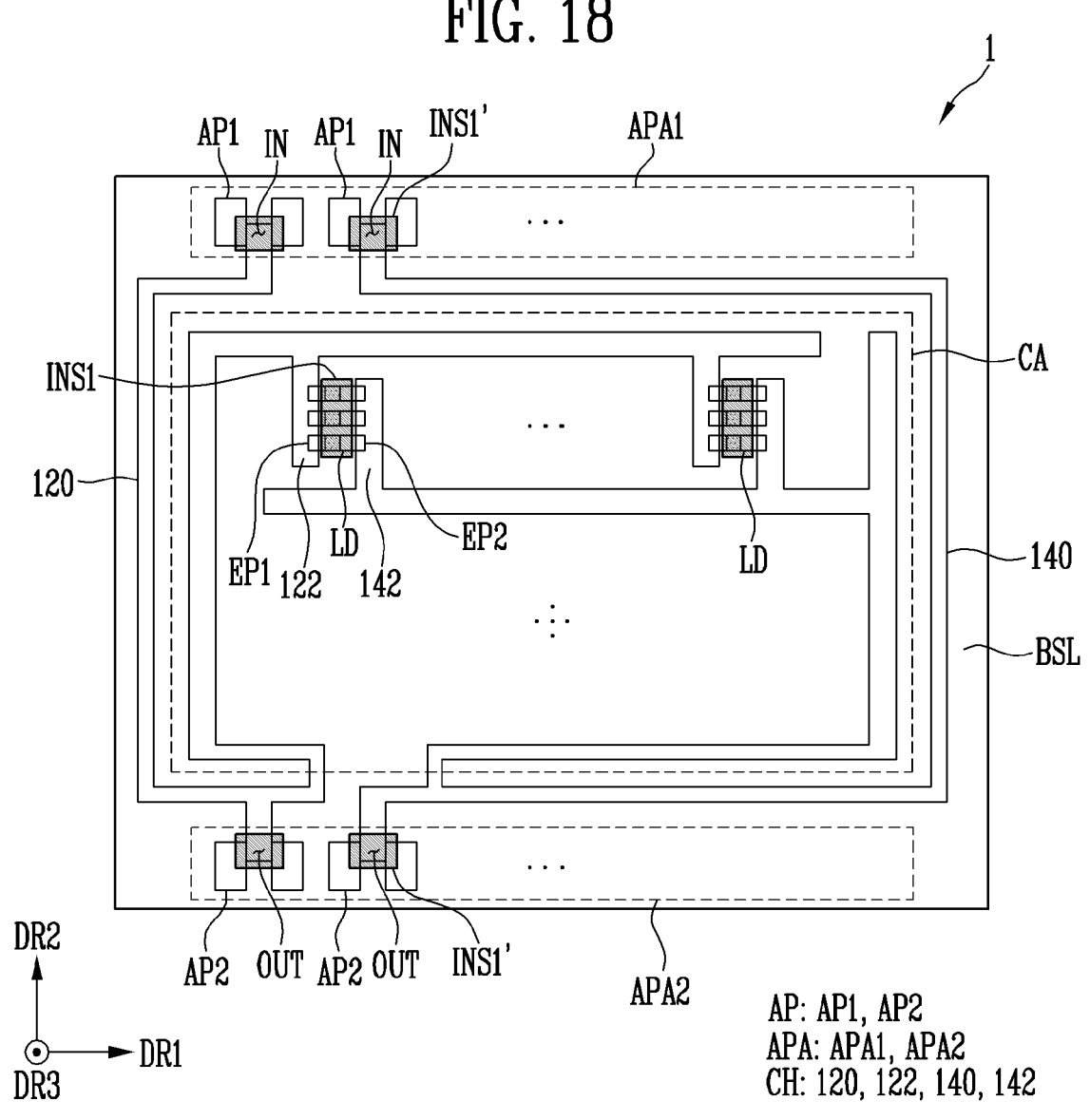

Referring to FIGS. 7, 12, and 18, in the disposing of the insulating layer (S150), the first insulating layer INS1 may be disposed on the light emitting elements LD, the inlet portion IN, and the outlet portion OUT.

The first insulating layer INS1 may be patterned on the light emitting elements LD in the cell area CA. According to an embodiment, the first insulating layer INS1 may cover at least the active layer AL of the light emitting element LD.

At least a portion of a first insulating layer INS1' may be patterned in the alignment pad area APA. For example, the first insulating layer INS1' may be disposed to overlap the inlet portion IN and the outlet portion OUT in a plan view. According to an embodiment, the first insulating layer INS1' may cover the inlet portion IN and the outlet portion OUT fluidly connected to the outside, so that the channels CH may be fluidly blocked from the outside.

Figure 13:
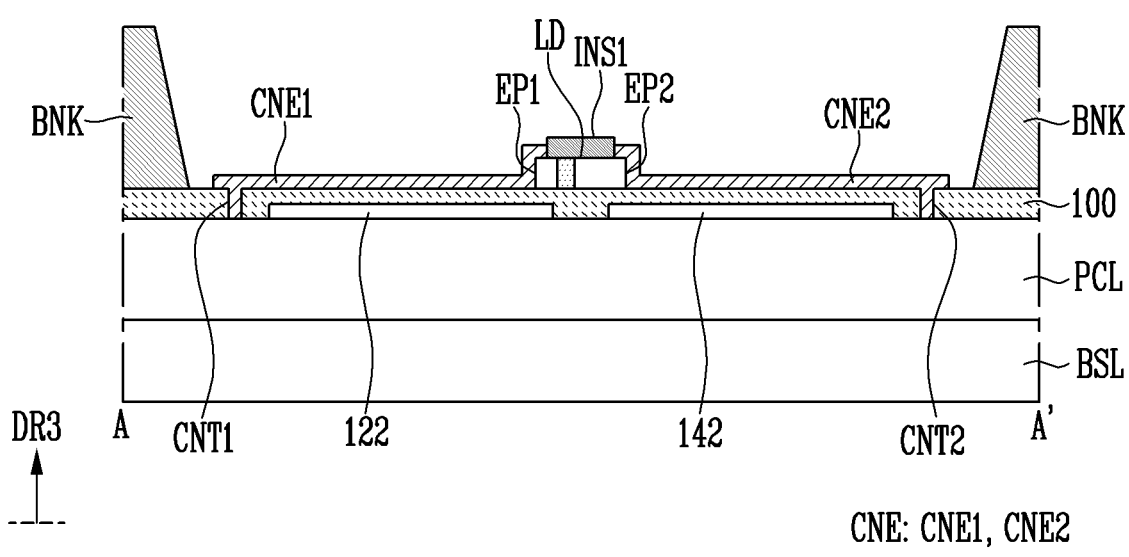
Figure 19:
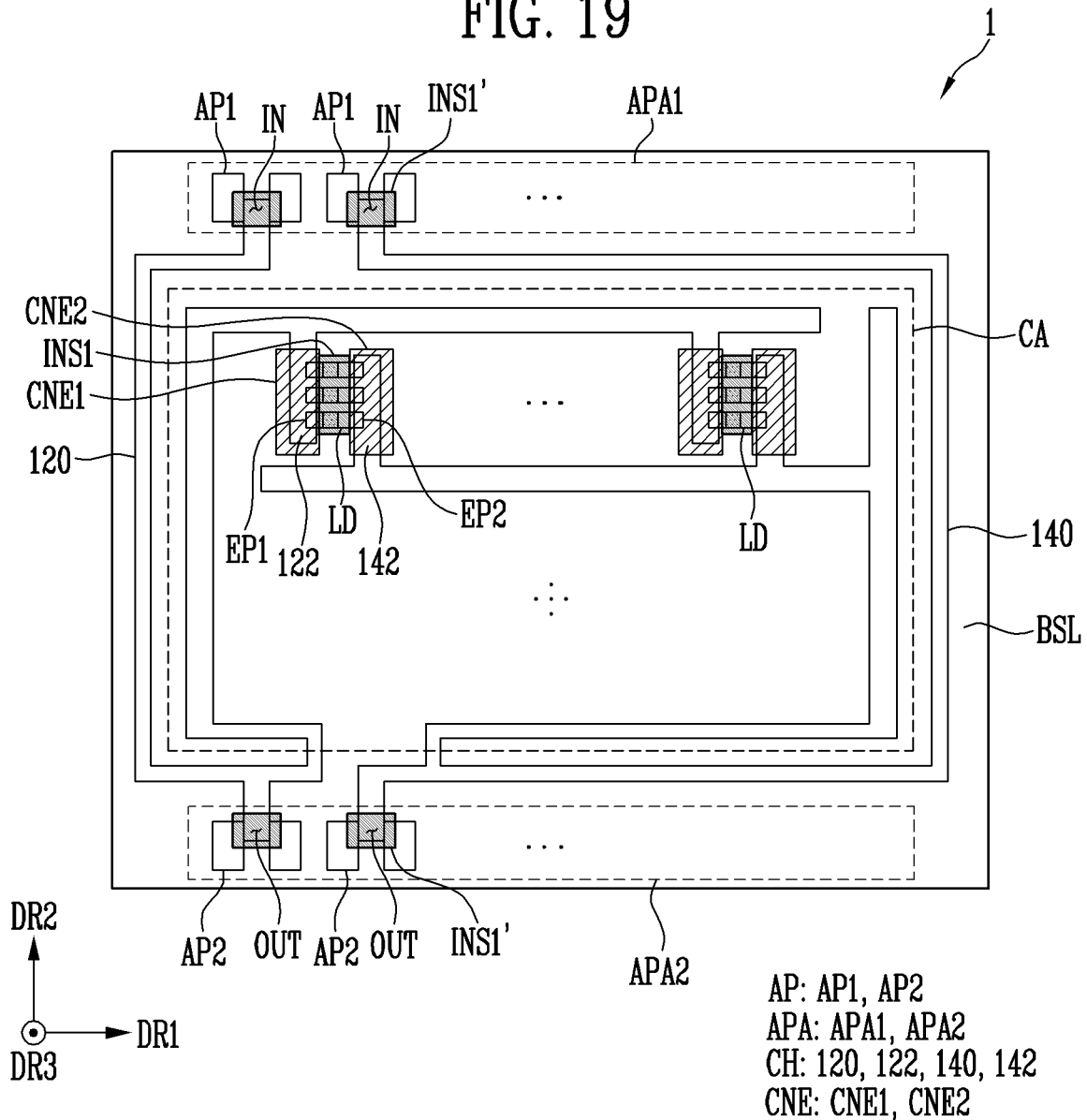

Referring to FIGS. 7, 13, and 19, in the disposing of the connection electrode (S160), the connection electrode CNE may be patterned to be electrically connected to the light emitting element LD.

The connection electrodes CNE may be disposed to be electrically connected to the light emitting elements LD. For example, the first connection electrode CNE1 may be patterned to be electrically connected to the first end EP1 of the light emitting element LD, and the second connection electrode CNE2 may be patterned to be electrically connected to the second end EP2 of the light emitting element LD.

Before the process is performed, according to an embodiment, holes may be formed in the channel formation pattern 100 so that the connection electrodes CNE may be electrically connected to other wirings of the pixel circuit layer PCL. Thereafter, the connection electrodes CNE may be formed, and the first and second contact portions CNT1 and CNT2 may be formed.

Thereafter, although not shown in the drawings, the above-described second insulating layer INS2 may be patterned, the scattering layer LSL, the overcoat layer OC, and the outer film layer POL may be disposed, and cell areas CA may be separated, so that the display device DD according to the embodiments can be manufactured.

According to the embodiments of the disclosure, a display device in which a risk due to light reflection can be substantially eliminated, and a method of manufacturing the same may be provided.

According to the embodiments of the disclosure, a display device robust against external impact, and a method of manufacturing the same may be provided.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A display device comprising:
   a channel formation pattern disposed on a base layer and including a first channel and a second channel spaced apart from each other; and
   light emitting elements disposed on the channel formation pattern,
   wherein the light emitting elements are aligned between the first channel and the second channel.

2. The display device of claim 1, wherein at least a portion of the first channel and the second channel are hollows surrounded by the channel formation pattern.

3. The display device of claim 2, further comprising:
   a pixel circuit layer disposed on the base layer and including circuit elements,
   wherein the first channel and the second channel are surrounded by an upper surface of the pixel circuit layer and the channel formation pattern.

4. The display device of claim 1, wherein the channel formation pattern includes an insulating polymer.

5. The display device of claim 1, wherein the channel formation pattern physically separates the first channel and the second channel.

6. The display device of claim 1, wherein the channel formation pattern includes grooves corresponding to the first channel and the second channel.

7. The display device of claim 1, further comprising:
   a first sub-pixel of a first color;
   a second sub-pixel of a second color; and
   a third sub-pixel of a third color,
   wherein the light emitting elements comprise:
      first light emitting elements arranged in the first sub-pixel and emitting light of the first color;
      second light emitting elements arranged in the second sub-pixel and emitting light of the second color; and
      third light emitting elements arranged in the third sub-pixel and emitting light of the third color.

8. The display device of claim 7, wherein each of the first light emitting elements, the second light emitting elements, and the third light emitting elements emit light of different colors.

9. The display device of claim 1, further comprising:
   a scattering layer disposed on the light emitting elements;
   an overcoat layer disposed on the scattering layer; and
   an outer film layer disposed on the overcoat layer.

10. The display device of claim 1, wherein each of the first channel and the second channel extends in a direction the light emitting elements are arranged.

21

11. A display device comprising:
a first sub-pixel and a second sub-pixel, wherein
each of the first sub-pixel and the second sub-pixel
includes:
   a first channel and a second channel, each disposed on
      a base layer and formed of a hollow; and
   a channel formation pattern defining the first channel
      and the second channel,
the first sub-pixel further includes first light emitting
   elements emitting light of a first color,
the second sub-pixel further includes second light emit-
   ting elements emitting light of a second color that is
   different from the first color, and
the first channel and the second channel are formed in the
   channel formation pattern without a conductive pattern
   directly adjacent thereto.
12. A method of manufacturing a display device compris-
ing:
   forming a channel formation pattern including a channel
      on a base layer;
   supplying a liquid metal to the channel;
   disposing a light emitting element on the channel forma-
      tion pattern; and
   removing the liquid metal from the channel.
13. The method of claim 12, wherein
the base layer includes a cell area to which the light
   emitting element is supplied,
the channel comprises an outer channel surrounding at
   least a portion of the cell area, and
the outer channel includes:
   an inlet portion to which the liquid metal is supplied on
      an end; and
   an outlet portion from which the liquid metal is dis-
      charged on another end.
14. The method of claim 13, further comprising:
forming an alignment pad to which an alignment signal is
   applied on a side of the cell area on the base layer,
wherein the supplying of the liquid metal includes:
   forming an outer liquid metal part in the outer channel;
      and
   electrically connecting the outer liquid metal part and
      the alignment pad.

22

15. The method of claim 13, wherein
the channel comprises a first channel and a second chan-
   nel formed in the cell area,
the outer channel comprises a first outer channel and a
   second outer channel fluidly separated from each other,
the first channel and the first outer channel are fluidly
   connected to each other; and
the second channel and the second outer channel are
   fluidly connected to each other.
16. The method of claim 13, further comprising:
forming an insulating layer on the light emitting element,
   the inlet portion, and the outlet portion.
17. The method of claim 16, further comprising:
forming a connection electrode electrically connected to
   the light emitting element, wherein
a portion of the insulating layer formed on the light
   emitting element exposes a first end and a second end
   of the light emitting element, and
the connection electrode is electrically connected to the
   first end and the second end of the light emitting
   element.
18. The method of claim 15, wherein
the supplying of the liquid metal includes:
   supplying at least a portion of the liquid metal to the
      first channel to form a first liquid metal part; and
   supplying at least another portion of the liquid metal to
      the second channel to form a second liquid metal
      part, and
the disposing of the light emitting element includes:
   supplying a first alignment signal to the first liquid
      metal part;
   supplying a second alignment signal to the second
      liquid metal part; and
   aligning the light emitting element in response to an
      electric field formed by the first alignment signal and
      the second alignment signal.
19. The method of claim 12, wherein the removing of the
liquid metal includes forming a hollow in the channel.
20. The method of claim 12, wherein the channel forma-
tion pattern includes an insulating polymer.

* * * * *